US008378554B2

(12) United States Patent
Nakamura et al.

(10) Patent No.: US 8,378,554 B2
(45) Date of Patent: Feb. 19, 2013

(54) MULTI-LAYER PIEZOELECTRIC ELEMENT AND INJECTION APPARATUS USING THE SAME

(75) Inventors: Shigenobu Nakamura, Kirishima (JP); Susumu Ono, Kirishima (JP); Takeshi Kato, Kirishima (JP); Koichi Nagasaki, Kirishima (JP)

(73) Assignee: Kyocera Corporation, Kyoto (JP)

( * ) Notice: Subject to any disclaimer, the term of this patent is extended or adjusted under 35 U.S.C. 154(b) by 622 days.

(21) Appl. No.: 12/088,821

(22) PCT Filed: Oct. 26, 2006

(86) PCT No.: PCT/JP2006/321375
§ 371 (c)(1),
(2), (4) Date: Jul. 9, 2010

(87) PCT Pub. No.: WO2007/049697
PCT Pub. Date: May 3, 2007

(65) Prior Publication Data
US 2010/0282874 A1    Nov. 11, 2010

(30) Foreign Application Priority Data

| Oct. 28, 2005 | (JP) | 2005-313860 |
| Nov. 29, 2005 | (JP) | 2005-343621 |
| Feb. 27, 2006 | (JP) | 2006-050977 |
| Mar. 29, 2006 | (JP) | 2006-089696 |

(51) Int. Cl.
*H01L 41/083* (2006.01)

(52) U.S. Cl. .................... 310/328; 310/366

(58) Field of Classification Search .................. 310/328, 310/363–366
See application file for complete search history.

(56) References Cited

U.S. PATENT DOCUMENTS

| 7,498,727 B2 * | 3/2009 | Nakamura et al. ............ 310/366 |
| 7,554,251 B2 | 6/2009 | Kondo et al. |
| 7,633,214 B2 | 12/2009 | Okamura et al. |
| 7,786,652 B2 * | 8/2010 | Nakamura et al. ............ 310/328 |

(Continued)

FOREIGN PATENT DOCUMENTS

| EP | 1930962 A1 | 6/2008 |
| JP | 03-064979 | 3/1991 |

(Continued)

OTHER PUBLICATIONS

Extended European search report dated Jan. 28, 2011 for corresponding European application 06822351.0 lists the references above.

*Primary Examiner* — Jaydi San Martin
(74) *Attorney, Agent, or Firm* — DLA Piper LLP (US)

(57) ABSTRACT

A multi-layer piezoelectric element of high durability wherein external electrodes do not peel off the surface of a stack even when operated continuously over a long period of time under a high electric field and a high pressure, a method for manufacturing the same and an injection apparatus using the same are provided. The multi-layer piezoelectric element comprises a stack 10 consisting of a plurality of piezoelectric layers 1 and a plurality of metal layers 2 which are stacked alternately one on another and external electrodes (covering member) 4 that cover at least a part of the side faces of the stack 10, wherein at least one metal layer 2a among the plurality of metal layers 2 is a porous metal layer 2a which has more voids than the metal layers 2b that adjoin the metal layer 2a on both sides thereof in the stacking direction, and a part of the external electrodes 4 infiltrates between two piezoelectric layers 1, 1 which adjoin the porous metal layer 2a in the stacking direction.

20 Claims, 23 Drawing Sheets

U.S. PATENT DOCUMENTS

| | | | |
|---|---|---|---|
| 8,049,397 B2 * | 11/2011 | Kato | 310/366 |
| 8,288,921 B2 * | 10/2012 | Terazono et al. | 310/328 |
| 2005/0120528 A1 | 6/2005 | Okuda et al. | 29/25.35 |
| 2007/0205700 A1 * | 9/2007 | Okamura et al. | 310/364 |
| 2007/0278907 A1 * | 12/2007 | Kondo et al. | 310/364 |
| 2010/0013359 A1 * | 1/2010 | Shoji et al. | 310/366 |
| 2010/0237751 A1 * | 9/2010 | Bosch et al. | 310/366 |

FOREIGN PATENT DOCUMENTS

| | | |
|---|---|---|
| JP | 03-043752 | 4/1991 |
| JP | 04352481 A * | 12/1992 |
| JP | 05-136479 | 6/1993 |
| JP | 07-030165 | 1/1995 |
| JP | 2000-031558 | 1/2000 |
| JP | 2000-332312 | 11/2000 |
| JP | 2004-363190 | 12/2004 |
| JP | 2005-174974 | 6/2005 |
| JP | 2005-223013 | 8/2005 |
| WO | 2005029603 A1 | 3/2005 |
| WO | 2005086247 A1 | 9/2005 |

* cited by examiner

Peripheral portion side of the external electrode

Prior Art

Prior Art

MULTI-LAYER PIEZOELECTRIC ELEMENT AND INJECTION APPARATUS USING THE SAME

CROSS-REFERENCE TO THE RELATED APPLICATIONS

This application is a national stage of international application No. PCT/JP2006/321375 filed on Oct. 26, 2006, which also claims benefit of priority under 35 U.S.C. §119 to Japanese Patent Application No. 2005-313860 filed Oct. 28, 2005, Japanese Patent Application No. 2005-343621 filed Nov. 29, 2005, Japanese Patent Application No. 050977 filed Feb. 27, 2006 and Japanese Patent Application No. 2006-089696 filed Mar. 29, 2006, the entire contents of which are incorporated herein by reference.

TECHNICAL FIELD

The present invention relates to a multi-layer piezoelectric element installed in a fuel injection apparatus of automobile engine or the like, and an injection apparatus using the same.

BACKGROUND ART

FIG. 28 is a perspective view of a multi-layer electronic element of the prior art. FIG. 29 is an enlarged sectional view of a junction between a side face of a stack constituting the multi-layer piezoelectric element and external electrodes. As shown in FIG. 28 and FIG. 29, the multi-layer piezoelectric element is constituted from a stack 110 and external electrodes 104 formed on a pair of opposing side faces.

The stack 110 is constituted from piezoelectric layers 101 and metal layers 102 stacked alternately one on another, but is formed in a so-called partial electrode structure where the metal layers 102 are not formed over the entire principal surfaces of the piezoelectric layers 101. The stack 110 has a no-electrode section where the internal electrodes 102 are not formed on the principal surface of the piezoelectric layer 101, and the no-electrode sections are disposed so as to alternately adjoin the pair of external electrodes 104. In this constitution, the internal electrodes 102 are exposed in every other layer on the opposite side faces of the stack 110 and are connected in every other layer to the pair of external electrodes 104, that are formed on the opposing side faces of the stack 110. Inactive layers 109 are formed on either side of the stack 110 in the stacking direction.

The external electrodes 104 are generally formed by applying an electrically conductive paste, which includes an electrically conductive material such as silver, onto the side faces of the stack 103, and baking the assembly (refer to, for example, Japanese Unexamined Patent Publication (Kokai) No. 2000-332312, Japanese Unexamined Patent Publication (Kokai) No. 2000-31558, Japanese Unexamined Patent Publication (Kokai) No. 2005-174974).

In case the multi-layer piezoelectric element is used as a multi-layer piezoelectric actuator, lead wires 106 are fastened onto the external electrodes 104 by soldering, and a predetermined voltage is applied across the pair of external electrodes 104 via the lead wires 106 so as to drive the multi-layer piezoelectric element. Particularly, in recent years, it has been practiced to apply an electric field of higher intensity and operate the device continuously over a long period of time, since a compact multi-layer piezoelectric element is required to maintain a large amount of displacement under a high pressure.

Patent document 1: Japanese Unexamined Patent Publication (Kokai) No. 2000-332312
Patent document 2: Japanese Unexamined Patent Publication (Kokai) No. 2000-31558
Patent document 3: Japanese Unexamined Patent Publication (Kokai) No. 2005-174974

DISCLOSURE OF INVENTION

Problems to be Solved by the Invention

However, the multi-layer piezoelectric actuator of the prior art has such problems that, when operated continuously over a long period of time under a high electric field and a high pressure, expansion and contraction of the stack generates a stress in the junction between the side face of the stack and the external electrode, which may cause a part of the external electrode to peel off the side face of the stack and make it unable to apply the voltage to some of the piezoelectric layers, thus resulting in an alteration of the displacement characteristic of the element during operation.

Accordingly, an object of the present invention is to provide a multi-layer piezoelectric element which has high durability wherein the external electrodes do not peel off the side face of the stack even when operated continuously over a long period of time under a high electric field and a high pressure, and an injection apparatus using the same.

Means for Solving Problem

The multi-layer piezoelectric element of the present invention and the injection apparatus using the same have the following constitutions.

(1) A multi-layer piezoelectric element comprising:
a stack having a plurality of piezoelectric layers and a plurality of metal layers, the piezoelectric layers and metal layers being stacked alternately one on another; and
a covering member that covers at least a part of the side faces of the stack,
wherein at least one of the metal layers is a porous metal layer which includes more voids than the metal layers that adjoin therewith on both sides thereof in the stacking direction, and a part of the covering member infiltrates between two piezoelectric layers which adjoin the porous metal layer in the stacking direction.

(2) The multi-layer piezoelectric element according to (1), wherein the covering member is a cladding resin that covers the side faces of the stack.

(3) The multi-layer piezoelectric element according to (1), wherein the covering member is a pair of external electrodes connected alternately to the plurality of metal layers.

(4) The multi-layer piezoelectric element according to (1), wherein the covering member is a cladding resin that covers the side faces of the stack and a pair of external electrodes connected alternately to the plurality of metal layers.

(5) The multi-layer piezoelectric element according to (3) or (4), wherein the external electrodes include an electrically conductive material and a glass material, and a part of the external electrodes that infiltrates between the two piezoelectric layers includes a higher content of the glass content than the rest of the external electrodes.

(6) The multi-layer piezoelectric element according to any one of (3) through (5), wherein the external electrodes comprise a plurality of layers stacked in a direction perpendicular to the side face of the stack and, among the plurality of layers, the layer that adjoins the side face of the stack includes a higher content of the glass material than the other layers.

(7) The multi-layer piezoelectric element according to any one of (3) through (6), wherein an isolated section of which thickness gradually decreases toward the periphery and is separated from the side face of the stack is formed in a peripheral portion of the external electrode.

(8) The multi-layer piezoelectric element according to (7), wherein voids exist between the isolated section and the side face of the stack.

(9) The multi-layer piezoelectric element according to (7) or (8), wherein an insulating resin is interposed in at least a part of the space between the isolated section and the side face of the stack.

(10) The multi-layer piezoelectric element according to (9), wherein the insulating resin is interposed on the peripheral side of the space between the isolated section and the side face of the stack.

(11) The multi-layer piezoelectric element according to (9), wherein the insulating resin fills in the space between the isolated section and the side face of the stack.

(12) The multi-layer piezoelectric element according to any one of (9) through (11), wherein the insulating resin is silicone resin.

(13) The multi-layer piezoelectric element according to any one of (7) through (12), wherein the external electrodes comprise a plurality of layers stacked in a direction perpendicular to the side face of the stack, and an outer layer has higher thermal expansion coefficient than an inner layer has.

(14) The multi-layer piezoelectric element according to (13), wherein, among the plurality of layers, the layer that adjoins the side face of the stack protrudes beyond the other layers toward the periphery.

(15) The multi-layer piezoelectric element according to (13) or (14), wherein the isolated section consists only of the layers that adjoin the side face of the stack.

(16) The multi-layer piezoelectric element according to any one of (7) through (15), wherein length of the isolated section projected onto the side face of the stack is 10 μm or longer.

(17) The multi-layer piezoelectric element according to any one of (7) through (16), wherein the angle which a straight line that connects the border between the part of the external electrodes which is in contact with the side face of the stack and the isolated section, and the distal end of the isolated section forms with the side face of the stack is not less than 1 degree nor more than 45 degrees.

(18) The multi-layer piezoelectric element according to any one of (7) through (17), wherein the distance between the isolated section and the side face of the stack is not less than 1 μm nor more than 50 μm.

(19) The multi-layer piezoelectric element according to any one of (1) through (18), wherein the porous metal layer is constituted from a plurality of partial metal layers dispersed between the two piezoelectric layers that adjoin the porous metal layer in the stacking direction, and the partial metal layers are disposed to be separate from each other.

(20) The multi-layer piezoelectric element according to (19), wherein the metal layers disposed on both sides to adjoin the porous metal layer in the stacking direction have the same polarity.

(21) The multi-layer piezoelectric element according to (19) or (20), wherein a part of the covering member infiltrates between the partial metal layers which adjoin each other.

(22) The multi-layer piezoelectric element according to (21), wherein a part of the covering member that infiltrates between the partial metal layers covers the surface of the partial metal layers.

(23) The multi-layer piezoelectric element according to any one of (1) through (22), wherein the metal layers disposed on both sides to adjoin the porous metal layer in the stacking direction are high density metal layers which have less voids than the metal layers that are disposed to adjoin these metal layers in the stacking direction.

(24) The multi-layer piezoelectric element according to (23), wherein the high density metal layers have thickness larger than the metal layers that are disposed to adjoin these metal layers in the stacking direction.

(25) The multi-layer piezoelectric element according to any one of (1) through (24), wherein the stack has the porous metal layers in plurality.

(26) The multi-layer piezoelectric element according to (25), wherein a part of the covering member infiltrates between the piezoelectric layers where the porous metal layer is disposed.

(27) The multi-layer piezoelectric element according to (25), wherein the plurality of porous metal layers are disposed in an orderly arrangement in the stacking direction of the stack, and a part of the covering member infiltrates between the piezoelectric layers where the porous metal layer are disposed.

(28) The multi-layer piezoelectric element according to any one of (1) through (27), wherein the part of the covering member which infiltrates between the piezoelectric layers satisfies the relation of D>0.1 t where t is thickness of the covering member in the stacking direction and D is depth of infiltrating between the piezoelectric layers.

(29) An injection apparatus comprising:
a container having an injection hole; and
the multi-layer piezoelectric element described in any one of (1) through (28), wherein a liquid held in the container is driven by the multi-layer piezoelectric element to jet through the injection hole.

(30) A fuel injection system comprising:
a common rail for storing a fuel at a high pressure;
the injection apparatus according to (29) for discharging the fuel stored in the common rail;
a pump for supplying the fuel at a high pressure to the common rail; and
an injection control unit that issues a drive signal to the injection apparatus.

Effect of the Invention

With the multi-layer piezoelectric element of the present invention, since at least one of the plurality of metal layers is a porous metal layer which has more voids than the metal layers that adjoin therewith on both sides thereof in the stacking direction, it is made possible to cause a part of the covering member to infiltrate into the voids of the porous metal layer during the process of manufacturing the element. As a part of the covering member infiltrates between the two piezoelectric layers that adjoin each other, bonding strength between the covering member and the side faces of the stack is improved. Specifically, the part of the covering member infiltrating into a part of the region between the two piezoelectric layers that adjoin each other forms such a structure that can be likened to piles that are driven into the stack through the side faces thereof, thus providing an anchoring effect. This structure binds the covering member and the stack firmly with each other and enables it to prevent the covering member from peeling off the side face of the stack, even when continuously operated over a long time under a high electric field and a high pressure. Also, because the stress generated between the stack, which expands and contracts during operation, and the covering member is mitigated by the deformation of the piezoelectric material caused by the pressure and the stress relaxation effect of the voids, reliability of bonding between the covering member and the stack is improved. Moreover, the part of the covering member infiltrating between the two piezoelectric layers where the porous metal layer including many voids is disposed, makes it easier for the stress relaxation effect of the voids to act on a part of the covering member. As a result, stress relaxation effect acts effectively on the part of the covering member, so that the part of the covering member becomes less likely to be affected by the stress generated during operation, thus further improving the reliability of bonding between the covering member and the stack infiltrating between the piezoelectric layers. Thus, the multi-layer piezoelectric element having high durability and long service life is provided.

In case the covering member is a cladding resin that covers the side faces of the stack, the cladding resin and the side faces of the stack are firmly joined with each other. This makes it possible to prevent the cladding resin from peeling off the side faces of the stack, even when continuously operated over a long time under a high electric field and a high pressure in an environment of high temperature and high humidity. This in turn enables it to prevent silver migration from being caused on the element surface by the moisture included in the atmosphere entering through the peeled portion, thereby preventing the function of the stack from degrading due to short-circuiting between the metal layers.

In case the covering member is a pair of external electrodes connected alternately to the plurality of metal layers, such a trouble can be prevented from occurring that the connection between a part of the metal layers and the external electrodes is interrupted, and therefore the element can be prevented from suffering deterioration of displacement characteristic.

In case the covering member is a cladding resin that covers the side faces of the stack and a pair of external electrodes connected alternately to the plurality of metal layers, bonding strength of the external electrodes can be further increased since the external electrodes are covered by the cladding resin that firmly joins with the side faces of the stack, in addition to the various effects described above being achieved.

In case the external electrodes include an electrically conductive material and a glass material, and a part of the external electrodes that penetrates between the two piezoelectric layers includes a higher content of the glass component than the rest of the external electrodes, the following effect can be achieved. That is, in the portion having much glass content, the glass component makes it easier for the metal component to diffuse and form solid solution in the piezoelectric layer, and therefore bonding strength increases between the part of the external electrodes infiltrating between the piezoelectric layers and the piezoelectric layers that are in contact therewith. As a result, the anchoring effect of the part of the external electrodes is improved, thus resulting in further improvement of the bonding strength of the external electrodes.

In case the external electrodes comprise a plurality of layers stacked in a direction perpendicular to the side face of the stack and, among the plurality of layers, the layer that adjoins the side face of the stack includes a higher content of the glass material than the other layers, it becomes easier for the glass component to infiltrate between the piezoelectric layers that adjoin each other, and therefore bonding strength between the external electrode and the side face of the stack can be increased further. Also, as the content of the glass component included in the outer layer is made lower than in the layers located on the side face of the stack, bonding strength of the lead wires soldered onto the external electrodes can be increased, because the solder has lower wettability with the glass component.

In case the isolated section which gradually become thinner toward the periphery and is separated from the side face of the stack is formed in peripheral portion of the external electrode, the isolated section can absorb the stress generated in the interface of bonding the external electrode and the stack, so as to suppress cracks from occurring in the stack whereon the external electrodes are bonded.

In case there are voids between the isolated section and the side face of the stack, the isolated section can deform freely, and therefore stress generated in the interface of bonding the external electrode and the stack can be significantly decreased.

In case there is an insulating resin in at least a part of the interface between the isolated section and the side face of the stack, it is made possible to prevent discharge from occurring between the peripheral portion of the external electrode and the inner electrode so that high reliability can be ensured while preventing the insulating property from deteriorating. In case the insulating resin is located on the periphery side between the isolated section and the side face of the stack, or the insulating resin fills the space between the isolated section and the side face of the stack, it is made possible to prevent discharge from occurring between the peripheral portion of the external electrode and the inner electrode more reliably. Furthermore, in case silicone resin is used as the insulating resin, it does not obstruct the deformation of the piezoelectric material while preventing discharge from occurring, and therefore high reliability can be achieved without restricting the displacement of the piezoelectric material.

In case the external electrodes comprise a plurality of layers stacked in a direction perpendicular to the side face of the stack and the outer layer has a higher thermal expansion coefficient than the inner layer has, or in case the layer, among the plurality of layers, that adjoins the side face of the stack protrudes beyond the other layers toward the periphery, the isolated section not in contact with the side face of the stack can be formed easily and effectively, thus making it possible to effectively absorb the stress generated in the interface of bonding the external electrode and the stack. Also, when the isolated section consists only of the layers that adjoin the side faces of the stack, the stress generated in the interface of bonding the external electrode and the stack can be more effectively reduced.

In case length of the projection of the isolated section onto the side face of the stack is 10 μm or longer, or the angle which a straight line that connects the border between the part of the external electrodes which is in contact with the side face of the stack and the isolated section and the distal end of the isolated section forms with the side face of the stack is in a range from 1 to 45 degrees, or the distance between the distal end of the isolated section and the side face of the stack is in a range from 1 μm to 50 μm, the stress generated in the interface of bonding the external electrode and the stack can be most effectively reduced.

In case the porous metal layer is constituted from a plurality of partial metal layers dispersed between the two piezoelectric layers which adjoin the porous metal layer in the stacking direction, and the partial metal layers are disposed separate from each other, then it is made possible to cause a part of the covering member to easily infiltrate between the dispersed partial metal layers to as to improve the anchoring effect, and therefore bonding strength between the covering member and the side face of the stack can be increased further.

In case the metal layers disposed on both sides of the porous metal layer to adjoin therewith in the stacking direction have the same polarity, two piezoelectric layers that adjoin the porous metal layer do not undergo displacement when the piezoelectric element operates. Accordingly, stress can be prevented from concentrating in the porous metal layer so that the multi-layer piezoelectric element having high durability can be provided. The porous metal layer in this form is constituted from the plurality of partial metal layers disposed in dispersed state separate from each other, and therefore does not function as the internal electrode.

In case a part of the covering member infiltrates between the partial metal layers that adjoin each other, higher anchoring effect can be achieved and therefore bonding strength between the external electrode and the side face of the stack can be significantly increased. Also, when a part of the covering member that infiltrates between the partial metal layers covers the surface of the partial metal layers, the area of contact between the partial metal layer and the part of the covering member increases so that the bonding strength of the external electrode can be increased further.

In case the metal layers disposed on both sides to adjoin the porous metal layer in the stacking direction are high density metal layers which have less voids than the metal layers that are disposed to adjoin these metal layers in the stacking direction, the area of contact between the edge of the high density metal layer and the covering member becomes larger, thus increasing the bonding strength between these members.

When the covering member is the external electrodes, in particular, it becomes more easier for the electrically conductive material to diffuse between the edge of the high density metal layer and the covering member, and therefore bonding strength of the external electrodes can be increased further by the diffusion due to the diffusion bonding effect. Thus, the anchoring effect is achieved by causing a part of the covering member to infiltrate between the piezoelectric layers where the porous metal layer is disposed, and the bonding strength is increased between the metal layers which are disposed on both sides of the porous metal layer t adjoin therewith through diffusion bonding. Providing too many porous metal layers for the purpose of increasing bonding strength between the external electrode and the side face of the stack may result in lower strength of the element. When the anchoring effect of the porous metal layer and the effect of diffusion bonding by means of the high density metal layer are combined as described above, however, it is made possible to increase the bonding strength of the external electrode and suppress the entire element from decreasing in strength.

Moreover, in case the high density metal layer is thicker than the metal layers which adjoin these metal layers in the stacking direction, the effects of increasing the contact area and enhancing the diffusion bonding are reinforced, it is made possible to increase the bonding strength of the covering member, particularly of the external electrodes.

In case the stack includes a plurality of porous metal layers, these porous metal layers can mitigate the stress generated when the element undergoes displacement, thereby improving the durability of the element further. Also, when a part of the covering member infiltrates between the piezoelectric layers where the porous metal layer is provided, bonding strength of the covering member is increased further.

In case the plurality of porous metal layers are disposed in an orderly arrangement in the stacking direction of the stack, and a part of the covering member infiltrates into the interface between the piezoelectric layers where the porous metal layer are disposed, bonding strength of the covering member with the side faces of the stack is increased substantially uniformly over the entire length in the stacking direction, thereby providing the multi-layer piezoelectric element having excellent durability.

In case the part of the covering member which infiltrates between the piezoelectric layers satisfies the relation of $D>0.1\,t$ where t is thickness of the covering member in the stacking direction and D is depth of infiltrating between the piezoelectric layers, the anchoring effect of the part of the covering member which infiltrates between the piezoelectric layers is enhanced. That is, this is because the increasing the depth D makes the contact area between the infiltrating portion and the piezoelectric layers larger, and hence enhances the anchoring effect.

The injection apparatus of the present invention has the multi-layer piezoelectric element housed in the container that has the injection hole, and therefore shows high durability even when continuously operated over a long time under a high electric field and a high pressure.

[Brief Description of Reference Numerals]

| | |
|---|---|
| 1 | Piezoelectric layer |
| 2 | Metal layer |
| 2a | Metal layer |
| 2a' | porous metal layer |
| 2b | Metal layer |
| 2c | Partial metal layer |
| 2d | Void |
| 2e | High density metal layer |
| 4 | External electrode |
| 4a | Infiltrating portion |
| 4b, 4c, 4d, 4e | Plurality of layers constituting external electrode |
| 6 | Lead wire |
| 9 | Inactive layer |
| 10 | Stack |
| 31 | Container |
| 33 | Injection hole |
| 35 | Valve |
| 37 | Fuel passage |
| 39 | Cylinder |
| 41 | Piston |
| 43 | Piezoelectric actuator |

BEST MODE FOR CARRYING OUT THE INVENTION

Multi-Layer Piezoelectric Element

First Embodiment

Figure 1:
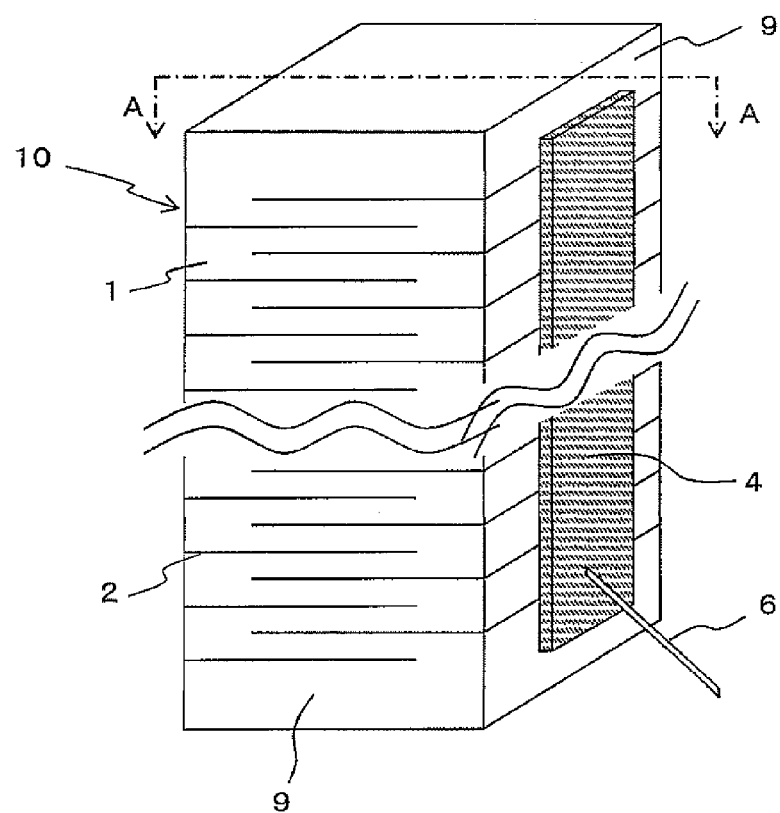
FIG. 1 is a perspective view of a multi-layer piezoelectric element according to first embodiment of the present invention.
Figure 2:
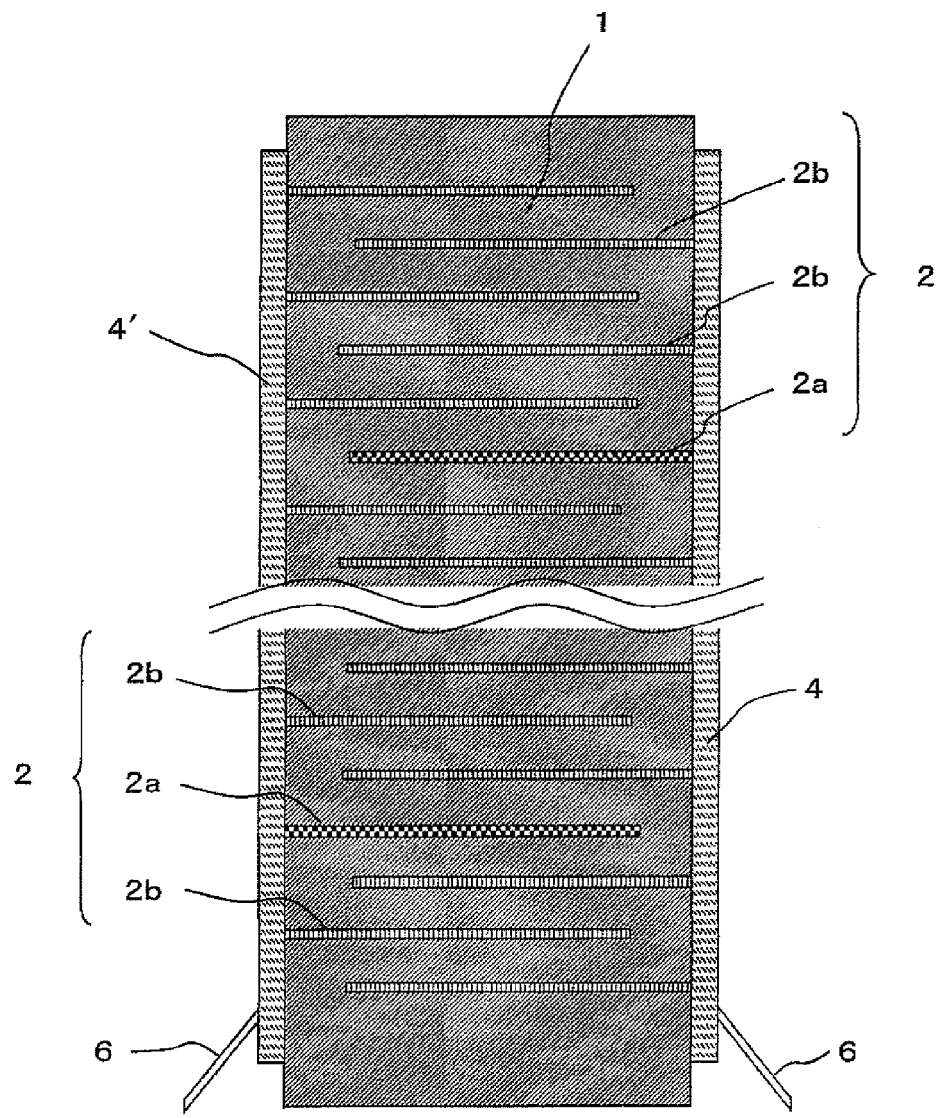
FIG. 2 is a sectional view taken along lines A-A (perpendicular to metal layer) in FIG. 1.
Figure 3:
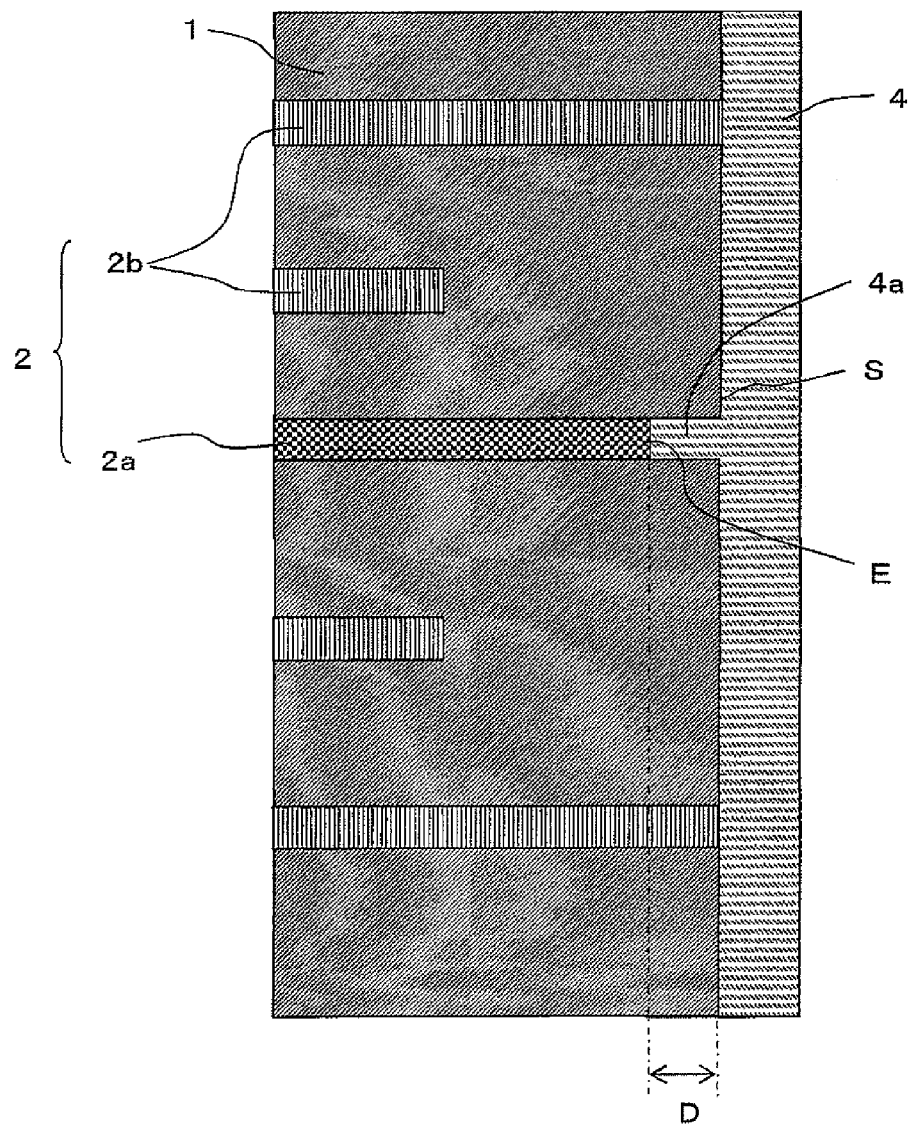
FIG. 3 is an enlarged sectional view of a junction between external electrode and side face of stack in the first embodiment.

One embodiment of the present invention will now be described in detail with reference to the accompanying drawings. FIG. 1 is a perspective view of a multi-layer piezoelectric element according to the first embodiment of the present invention. FIG. 2 is a sectional view taken along lines A-A in FIG. 1. FIG. 3 is an enlarged sectional view of a junction between external electrode 4 and the side face of a stack 10 in this embodiment.

As shown in FIG. 1 and FIG. 2, the multi-layer piezoelectric element of this embodiment has the stack 10 formed by stacking a plurality of piezoelectric layers 1 and a plurality of metal layers 2 alternately, with a pair of the external electrodes (covering members) 4, 4' bonded on opposing side faces of the stack 10 for electrically connecting the metal layers on the end thereof in every other layer. Lead wires 6 are connected to the external electrodes 4, 4' by soldering or the like. These lead wires 6 can be connected to an external voltage source (not shown). This constitution enables it to supply a predetermined voltage, required to have the piezoelectric layers 1 displaced by the reverse piezoelectric effect, to the metal layers 2. The metal layers 2 disposed between the piezoelectric layers 1 are formed from a metallic material such as silver-palladium.

When the predetermined voltage is applied to the piezoelectric layers 1 via the lead wires 6, the piezoelectric layers undergo displacement due to reverse piezoelectric effect. On the other hand, the stack 10 has a plurality of inactive layers 9, formed from piezoelectric material, being disposed on both ends of the stack 10 in the stacking direction. The inactive layers 9 are not provided with the metal layers 2 on one end thereof, and therefore do not undergo displacement even when a voltage is applied.

As shown in FIG. 2 and FIG. 3, the multi-layer piezoelectric element of this embodiment is characterized in that an infiltrating portion 4a is formed, which is a part of the external electrode 4 (or the external electrode 4') infiltrating into a region between two piezoelectric layers 1 which adjoin each other. Specifically, the infiltrating portion 4a is formed in the region located between two piezoelectric layers 1 which adjoin each other, and between an end E of the metal layer 2a and a side face S of the stack 10. This area is formed not only on the side of the external electrode 4 but also on the side of the external electrode 4'. The infiltrating portion 4a which is a part of the external electrodes 4 is in continuity with the main body of the external electrode 4 bonded onto the side face S of the stack 10.

By having the infiltrating portion 4a formed so as to infiltrate into the region between the piezoelectric layers 1, such a structure is formed that may be likened to piles driven into the stack 10 through the side faces S thereof, thus providing the anchoring effect that significantly improves the bonding strength between the external electrode 4 and the stack 10. As a result, since the external electrode 4 can be prevented from peeling off the side face S of the stack 10 even when the multi-layer piezoelectric element is continuously operated over a long time under a high electric field and a high pressure, such troubles can be prevented from occurring as some of the piezoelectric layers 1 are not supplied with the voltage due to breakage of connection between some of the metal layers 2 and the external electrodes 4, and the displacement characteristic can be prevented from deteriorating during operation.

The stress, generated in the interface between the stack and the covering member as the stack expands and contracts during operation, propagates to the piezoelectric layer 1 through the infiltrating portion 4a, which is a part of the external electrode 4 (or the external electrode 4') that infiltrates into the interface. Crystal structure of the piezoelectric material that adjoins the infiltrating portion 4a changes in accordance to the propagating stress, thereby absorbing the stress.

Particularly, in case the infiltrating portion is a part of the external electrode formed mainly from a metallic component, in particular, the metal itself deforms so as to mitigate the stress and, at the same time, the infiltrating portion 4a presses the piezoelectric material which makes contact therewith, so as to make it easier for the crystal structure of the piezoelectric material to change.

In addition, voltage is not applied to the portion of the piezoelectric layers 1 which faces the void, and the space allows the piezoelectric material to deform according to the stress. As a result, another stress relieving effect can be put to work, that the stress in the piezoelectric material can be mitigated by the portion that faces the void.

Moreover, when the distal end of the infiltrating portion 4a is caused to infiltrate while branching out between the partial metal layers of the porous metal layer, the effect of dispersing the stress is enhanced thereby improving the stress relieving effect further. These effects collectively improve the reliability of bonding between the covering member and the stack, thus enabling it to provide the multi-layer piezoelectric element of high durability and longer service life.

It is preferable that the infiltrating portion 4a which infiltrates into the region between the side E of the metal layer 2a and the side face S of the stack 10 satisfies the relation of $D > 0.1\,t$ where D is depth of infiltration and t is thickness of the infiltrating portion 4a. It is particularly preferable that depth D is 1 μm or more, and more preferably 5 μm or more for the purpose of increasing the bonding strength. When depth D is 1 μm or more, sufficient anchoring effect is achieved so as to ensure sufficient bonding strength between the external electrode 4 and the side face S of the stack 10.

In this embodiment, the phrase that a part of the external electrode 4 infiltrates in the form of the infiltrating portion 4a between the piezoelectric layers 1 means that a part of the external electrode 4 infiltrates into the gap between the piezoelectric layers 1, not that a part of the external electrode 4 infiltrates through surface irregularity which has a size on the order of surface roughness of the side face of the stack 10.

It is also preferable that a plurality of the infiltrating portions 4a are disposed in the stacking direction of the stack 10, and it is more preferable that the infiltrating portions 4a are disposed in an ordered arrangement in the stacking direction of the stack 10. By disposing the infiltrating portions 4a, which are part of the external electrodes 4, in an ordered arrangement in the stacking direction, it is made possible to bond the external electrodes 4 firmly and substantially uniformly over the entire length in the stacking direction of the stack 10.

It is preferable that the infiltrating portions 4a are provided in a ratio of one for every group of metal layers 2 not less than one half the total number thereof included in the stack 10, more preferably one for every group of metal layers 2 not less than one eighth of the total number, and most preferably one for every group of metal layers 2 not less than one fifteenth of the total number. When the infiltrating portions 4a are provided in a ratio of one for every group of more metal layers 2 than one half the total number of the metal layers 2, the small proportion of the infiltrating portions 4a may result in uneven bonding strength of the external electrodes 4 over the entire length in the stacking direction of the stack 10.

The phrase that the infiltrating portions 4a are disposed in an ordered arrangement refers not only to a case where the infiltrating portions 4a are disposed at the same intervals, but also to a case where the infiltrating portions 4a are disposed at intervals which are similar to each other to such an extent that the external electrodes 4 can be bonded firmly and substantially uniformly on the side face S of the stack 10 over the entire length in the stacking direction of the stack 10. Specifically, it is preferable that the spacing between any adjacent infiltrating portions 4a is within ±20%, more preferably within ±15% of the mean interval between infiltrating portions 4a and most preferably the same.

The infiltrating portions 4a can be disposed in an ordered arrangement by, for example, placing the infiltrating portion 4a for every predetermined number (for example, 20) of the metal layers. In case the total number of the metal layers 2 is not divisible by the predetermined number, the infiltrating portions 4a may be placed without following the rule of the same intervals, near the ends of the stack 10.

It is also preferable that the infiltrating portions 4a are disposed alternately on the side face of the stack 10 whereon the external electrode 4 of positive polarity is formed and on the side face of the stack 10 whereon the external electrode 4 of negative polarity is formed. In this constitution, part of the external electrode 4 of positive polarity and part of the external electrode 4 of negative polarity infiltrate evenly between the piezoelectric layers 1, so that the external electrodes 4 are firmly bonded on both sides of the stack 10 in a well-balanced manner.

When emphasis is placed solely on performance, it is preferable that the infiltrating portion 4a is placed between every pair of adjacent piezoelectric layers 1. In this case, the external electrodes 4 can be bonded more firmly on the side face S of the stack 10 over the entire length in the stacking direction of the stack 10, so that displacement of the element can be surely prevented from decreasing during operation, without the external electrode 4 peeling off the side face of the stack 10 even when continuously operated over a long time under a high electric field and a high pressure. On the other hand, when the infiltrating portions 4a are disposed at regular intervals as described above, not in such an arrangement as one infiltrating portion 4a is placed between every pair of adjacent piezoelectric layers, performance requirement and the requirement of the manufacturing cost can be balanced.

In the multi-layer piezoelectric element of this embodiment, metal element included in the metal electrode 2a disposed between the piezoelectric layers where the infiltrating portion 4a is formed is preferably at least one kind selected from among the metals of group 8 to group 11 of the Periodic Table. Forming the metal layer 2a mainly from such component makes it possible to fire the piezoelectric layers 1 and the metal layers 2a at the same time, so as to firmly bond the piezoelectric layers 1 and the metal layers 2a. Even when the metal layer 2a receives a stress generated by the displacement of the piezoelectric element, the stress would not be concentrated since the metal layer 2a is formed from a metal that is pliant enough to expand and contract, thus making it possible to provide the multi-layer piezoelectric element having high durability. It is particularly preferable that the metal element that constitutes the metal layer 2a is an alloy consisting of at least one kind selected from among Ni, Pt, Pd, Rh, Ir, Ru and Os which are metals of group 8 to group 10 of the Periodic Table, and at least one kind selected from among Cu, Ag and Au which are metals of group 11 of the Periodic Table. This is because such a metal composition is advantageous in volume production when the alloy powder synthesizing technology available today is employed. The metal element that constitutes the metal electrode 2a may also be a metal element of group 11 of the Periodic Table.

Further, it is also preferable that the metal layer 2a is formed mainly from a metal of group 11 of the Periodic Table, and the metal electrode 2a disposed between the piezoelectric layers 1 where the infiltrating portion 4a is formed has higher proportion R of the metal of group 11 of the Periodic Table than the other metal layers 2b. By setting the proportion R of the metal of group 11 of the Periodic Table such as copper, silver or gold which has a low Young's modulus in this way, it is made possible to keep the Young's modulus of the metal layer 2a at a relatively low level. As a result, the metal layer 2a can effectively absorb the strain caused by the expansion and contraction of the stack 10 during operation, thereby decreasing the strain caused by the expansion and contraction of the stack 10 in the external electrodes 4 which are firmly bonded onto the side face S of the stack 10. As a result, such trouble can be prevented from occurring that a part of the external electrode 4 peels off the side face S of the stack 10 or the external electrode 4 is broken when the element is continuously operated over a long time under a high electric field and a high pressure.

When the metal layers 2 and the external electrodes 4 are formed from the same main component, the metal layers 2 and the external electrodes 4 are firmly bonded through diffusion bonding, as the common main component of the metal layers 2 and the external electrodes 4 diffuse to each other through the junction when an electrically conductive paste that would become the external electrodes 4 is applied on the side face of the stack 10 and is fired. When diffusion bonding occurs between the metal layers 2 and the external electrodes 4, a solid solution region is formed where components of the metal layers 2 and the external electrodes 4 form a solid solution. In such a situation, the phrase "end E of the metal layer 2a" refers to the border between the solid solution region and the region consisting of only the metal layer 2a.

The piezoelectric layer 1 is formed from a piezoelectric ceramic material such as lead titanate zirconate Pb(Zr—Ti)O$_3$ (hereinafter abbreviated to PZT) or barium titanate BaTiO$_3$ as the main component. The piezoelectric ceramic material preferably has a high value of piezoelectric strain constant d$_{33}$ which represents the piezoelectric characteristic.

The piezoelectric layer 1 preferably has dimension of 40 to 250 μm in thickness, namely the distance between the metal layers 2. With this dimension, a compact multi-layer piezoelectric actuator with low profile can be provided where insulation breakdown can be prevented from occurring in the piezoelectric layers 1, even when a larger number of the piezoelectric layers are stacked in order to achieve a larger amount of displacement.

Second Embodiment

Figure 4:
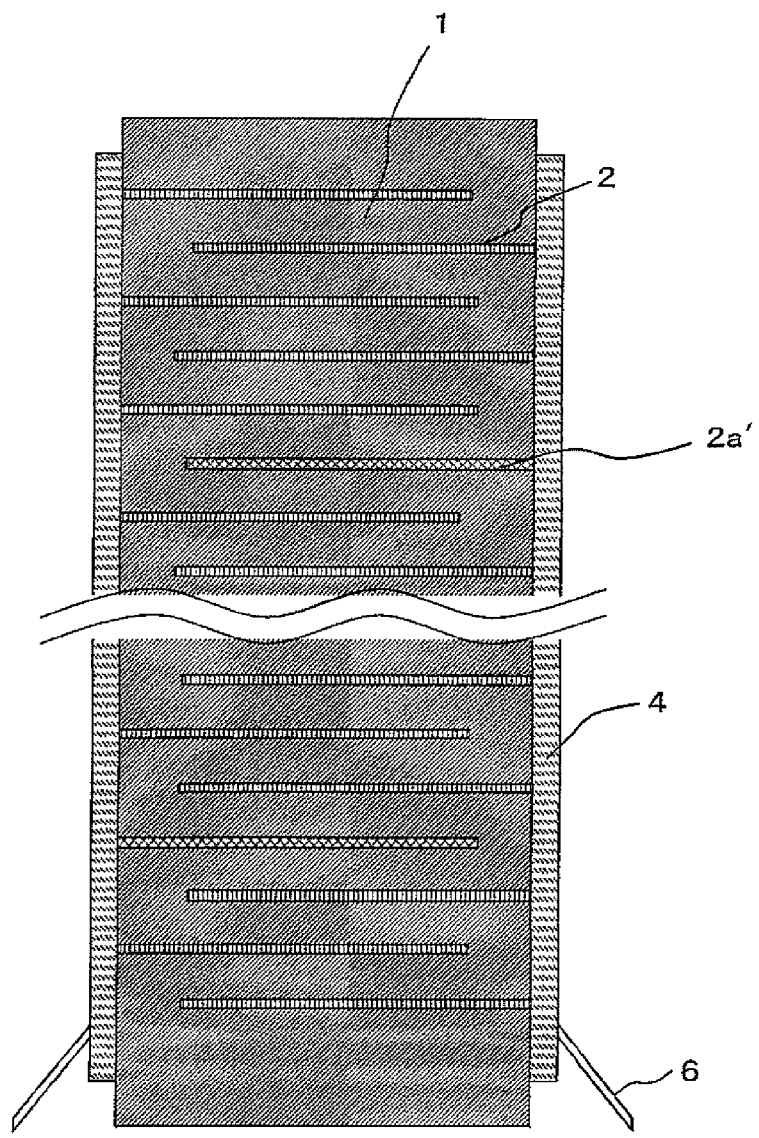
FIG. 4 is a sectional view (along a line perpendicular to metal layer) of multi-layer piezoelectric element according to second embodiment.
Figure 5:
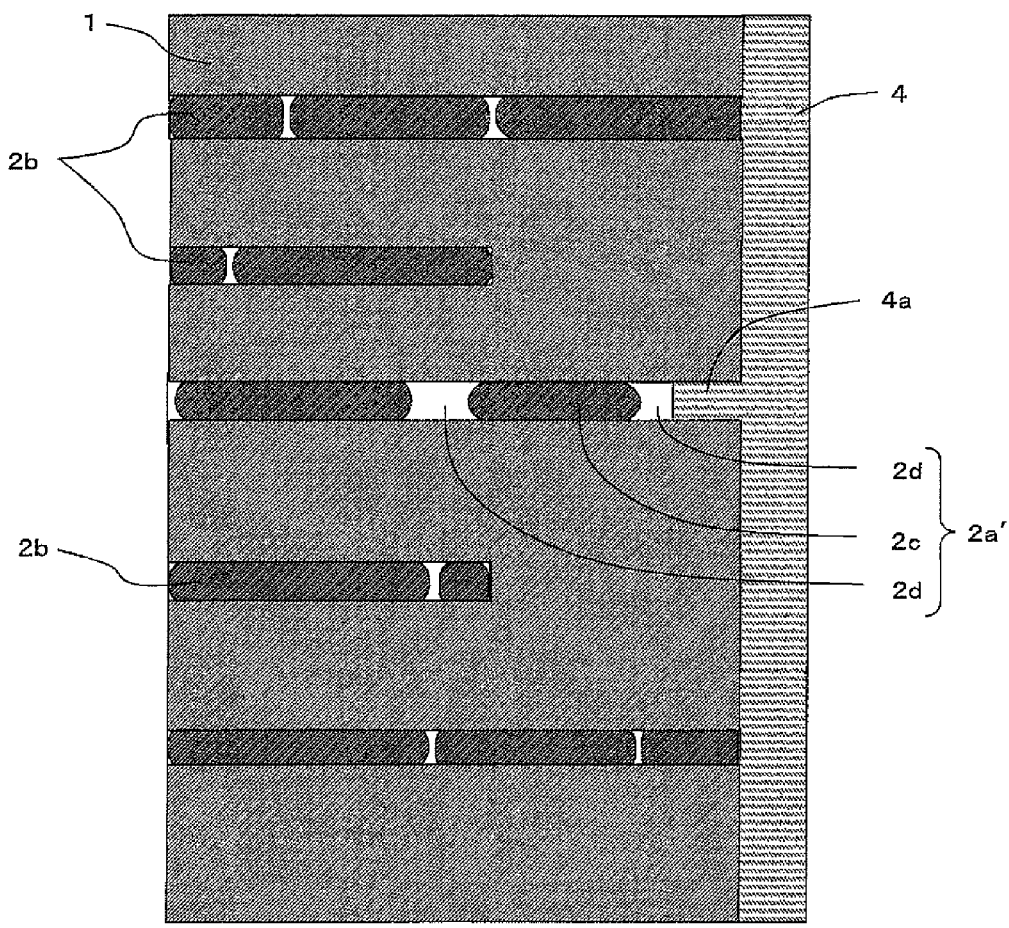
FIG. 5 is an enlarged sectional view of a junction between the external electrode and the side face of the stack in the second embodiment.

FIG. 4 is a sectional view showing a multi-layer piezoelectric element according to the second embodiment of the present invention. FIG. 5 is an enlarged sectional view of a junction between the external electrodes 4 and the side face S of the stack 10 in the second embodiment. As shown in FIG. 4 and FIG. 5, some metal layers 2a' among the plurality of metal layers 2 include more voids 2d than the metal layers 2b provided on both sides adjacent to the metal layers 2a' in the multi-layer piezoelectric element of the second embodiment. Comparison of the numbers of voids may be made by measuring the void ratio in the metal layers. In this embodiment, the metal layers 2a' have higher void ratio than the metal layers 2b provided on both sides adjacent to the metal layers 2a'. Hereafter, the metal layers 2a' may also be referred to as porous metal layer 2a'.

Figure 6:
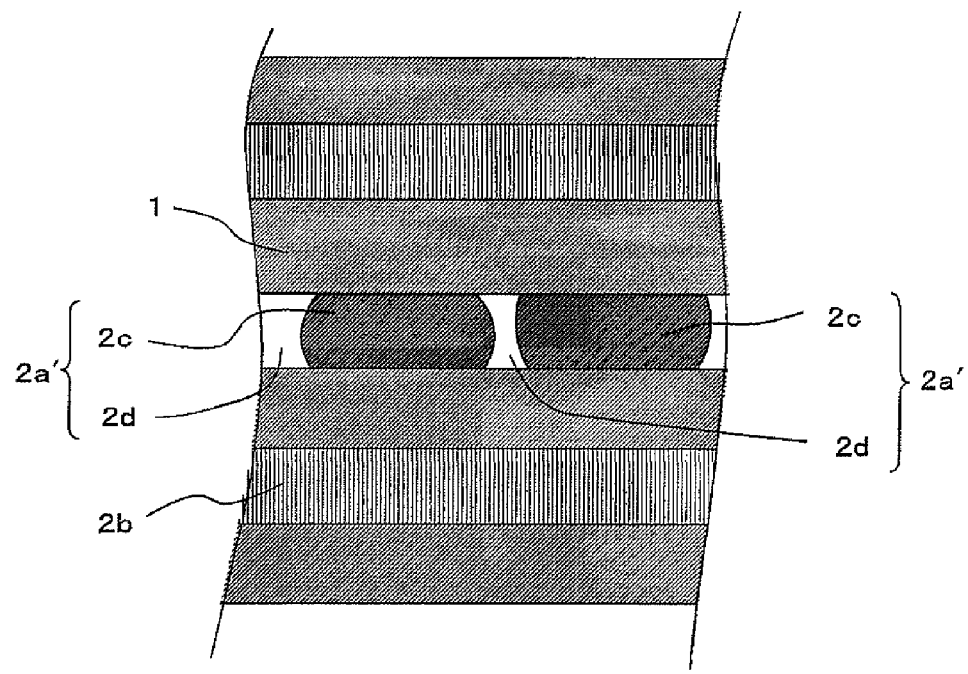
FIG. 6 is an enlarged sectional view of a portion around a porous metal layer in the multi-layer piezoelectric element according to the second embodiment.

FIG. 6 is an enlarged sectional view of a portion around the porous metal layer 2a' in the multi-layer piezoelectric element according to the second embodiment. As shown in FIG. 6, in the multi-layer piezoelectric element, the porous metal layer 2a' comprises a plurality of partial metal layers 2c (partial metal layers distributed like islands) which are dispersed between the piezoelectric layers 1 and the voids 2d. Formed between the piezoelectric layers 1 where the porous metal layer is disposed are the infiltrating portions 4a which are part of the external electrodes 4. Since the porous metal layer 2a' includes more voids 2d than the metal layers 2b which adjoin on both sides therewith, component of the external electrodes 4 can infiltrate deep into the metal layer 2a' that includes many voids 2d, so as to effectively improve the bonding strength between the external electrode 4 and the stack 10. Specifically, when the electrically conductive paste that would become the external electrodes 4 is applied to the side face S of the stack 10 and is fired, the electrically conductive paste infiltrates through capillary effect into the metal layers 2c which are distributed like islands at a temperature not lower than the softening point of the electrically conductive paste. As a result, the multi-layer piezoelectric element having the external electrodes 4 effectively infiltrating into the metal layers 2a is obtained. As a result, the external electrodes 4 can be firmly bonded onto the side face of the stack 10, and such trouble can be prevented from occurring as a part of the external electrode peels off the side face of the stack 10 even when continuously operated over a long time under a high electric field and a high pressure.

This embodiment also provides such an advantage as described below, should such a problem occurs as the external electrode peels off the side face S of the stack 10 due to a surge current flowing in the drive circuit. In case the external electrode 4 infiltrates into a dense metal layer, a part of the external electrode 4 peeling off the side face S of the stack 10 may also pulls the dense metal layer, which firmly joins with the external electrode 4, off the inside of the stack 10, which may cause crack in the piezoelectric layer 1 due to the stress of pulling off. In case a part of the external electrode 4 is caused to infiltrate into the metal layer 2a' which includes many voids 2d as in this embodiment, only the piles of the external electrode 4 are pulled off the metal layer 2a' in which a part of the external electrode 4 infiltrates, so that only the part of the external electrode peels off the side face of the stack 10, without affecting the multi-layer piezoelectric element as a whole, even when a surge current flows in the drive circuit due to a trouble as described above.

Void ratio in the metal layer 2a' is preferably from 10 to 95%, more preferably from 40 to 90%, in order to have the part of the external electrodes 4 effectively infiltrate between the piezoelectric layers 1. When the void ratio is 10% or higher, the part of the external electrodes 4 can effectively infiltrate between the piezoelectric layers so as to achieve sufficient bonding strength between the external electrode 4 and the side face S of the stack 10. On the other hand, in case the void ratio is within 95%, bonding strength between the metal layer 2a' and the piezoelectric layers 1 disposed adjacent thereto is prevented from decreasing, so that peel-off or other trouble do not occur during firing.

Size of the partial metal layers 2c (width in the direction perpendicular to the stacking direction) dispersed over the metal layer 2a is preferably in a range from 1 to 100 μm. When size of the partial metal layers 2c is 1 µm or larger, the porous metal layer 2a' will not become too thin and the part of the external electrodes 4 can be caused to effectively infiltrate into the metal layer 2a. When size of the partial metal layers 2c is not larger than 100 µm, the metal layer 2a can effectively absorb the stress caused by the expansion and contraction of the stack 10 during operation, so as to prevent the stress from concentrating in the partial metal layers 2c and prevent cracks from occurring in the piezoelectric layers 1. Thus, by setting the size of the partial metal layers 2c dispersed over the metal layer 2a in a range from 1 to 100 µm, it is made possible to cause a part of the external electrodes to infiltrate into the porous metal layer 2a' and have the stress generated by the expansion and contraction of the stack 10 dispersed and absorbed by the porous metal layer 2a'. Size of the partial metal layers 2c dispersed over the metal layer 2a is more preferably in a range from 3 to 50 µm. The porous metal layer 2a' may have substantially spherical or any other shape.

In case the porous metal layer 2a' is constituted with a plurality of partial metal layers 2c dispersed therein, it may not have electrical conductivity so as not to function as electrode. In this case, the metal layers 2a' may be formed either partially (partial electrode structure) or over the entire surface of the piezoelectric layer 1.

Number of voids may be compared between the metal layer 2a' and the metal layer 2b, by using a scanning electron microscope (SEM), metallurgical microscope, optical microscope or the like to observe a cross section of the metal layer 2a' and a cross section (a section parallel to the stacking direction or perpendicular to the stacking direction) of the metal layer 2b, and comparing the images of the sections obtained thereby. If the images of the sections show a significant difference in the number of voids in the metal layer 2a' and the metal layer 2b, then comparison may be carried out visually. If no significant difference is recognized in the number of voids in the metal layer 2a' and the metal layer 2b, void ratio measured as described below may be compared.

Void ratio of a metal layer refers to the proportion (%) occupied by voids to the total area of the metal layer in section (a section parallel to the stacking direction or perpendicular to the stacking direction) of the stack 10. Methods for measuring the void ratio are classified roughly into the following two. First is a method of observing the stack 10 in a section in a section thereof parallel to the stacking direction, and the second is a method of observing the stack 10 in a section thereof perpendicular to the stacking direction.

Measurement of the void ratio by the first method may be carried out as follows. First, the stack 10 is polished by known polishing means so as to reveal a section parallel to the stacking direction. Polishing operation may be done, for example, by using a desktop polishing machine KEMET-V-300 manufactured by KEMET Japan Inc. and a diamond paste. Void ratios of the metal layer 2a' and the metal layer 2b may be measured by observing the section exposed by this polishing operation, under a scanning electron microscope (SEM), metallurgical microscope, optical microscope or the like and processing an image of the section taken in this observation. For example, on an image of the metal layer 2a' or the metal layer 2b obtained by using an optical microscope, by painting the portions representing the voids in black and painting the rest in white, the void ratio can be calculated as (Area of black portions)/(Area of black portions+area of white portions) in percentage. In case the section is shown in a color image, the colors may be converted in gray scale so as to divide the section into black portions and white portions. If it is required to set a threshold that separates two tones of black and white, the threshold may be set by means of image processing software or by visual inspection.

Measurement of the void ratio by the second method may be carried out as follows. First, the stack 10 is polished in the stacking direction by known polishing means so as to reveal a section of the metal layer 2a' or a section of the metal layer 2b (a section perpendicular to the stacking direction) in which void ratio is to be measured. Polishing operation may be done, for example, by using a desktop polishing machine KEMET-V-300 manufactured by KEMET Japan Inc. and a diamond paste. Void ratios of the metal layer 2a' and the metal layer 2b may be measured by observing the section exposed by this polishing operation, under a scanning electron microscope (SEM), metallurgical microscope, optical microscope or the like and processing an image of the section taken in this observation. For example, on an image of the metal layer 2a' or the metal layer 2b obtained by using an optical microscope, by painting the portions representing the voids in black and painting the rest in white, the void ratio can be calculated as (Area of black portions)/(Area of black portions+area of white portions) in percentage. In case the section is shown in a color image, the colors may be converted in gray scale so as to divide the section into black portions and white portions. If it is required to set a threshold that separates two tones of black and white, the threshold may be set by means of image processing software or by visual inspection. When observing the section of the metal layer 2a' or the metal layer 2b, it is preferable to observe the section exposed by polishing the layer to a position about one half the thickness thereof. In case the metal layer 2a' or the metal layer 2b is thin and there is relatively large variability in the thickness, entire section of the metal layer 2a' or the metal layer 2b may not be exposed by polishing. In such a case, such an operation may be repeated as the metal layer 2a' or the metal layer 2b is polished until a part thereof is exposed so as to obtain an image of the exposed portion, and polishing further so as to observe the other portion. The partial images obtained in the series of operations may be added up so as to obtain the information on the entire section of the metal layer 2a' or the metal layer 2b.

Figure 7:
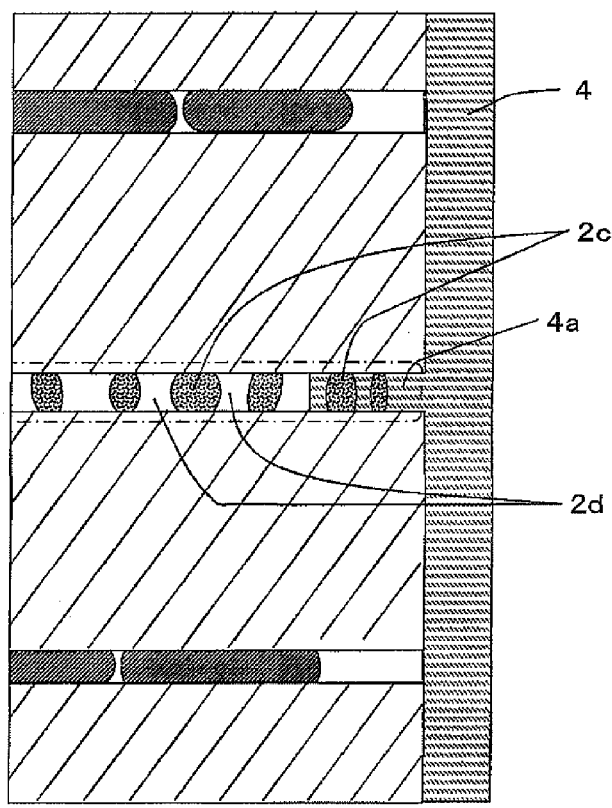
FIG. 7 is an enlarged sectional view of a portion around the porous metal layer in the second embodiment.

In the second embodiment, it is preferable that the infiltrating portion 4a which is a part of the external electrode 4 that infiltrates between the plurality of partial metal layers 2c covers the surface of the partial metal layers 2c, as shown in FIG. 7. By covering the surface of the partial metal layers 2c, contact area between the infiltrating portion 4a and the partial metal layers 2c is increased and bonding strength between the external electrode 4 and the side face S of the stack 10 is improved further.

Third Embodiment

Figure 8:
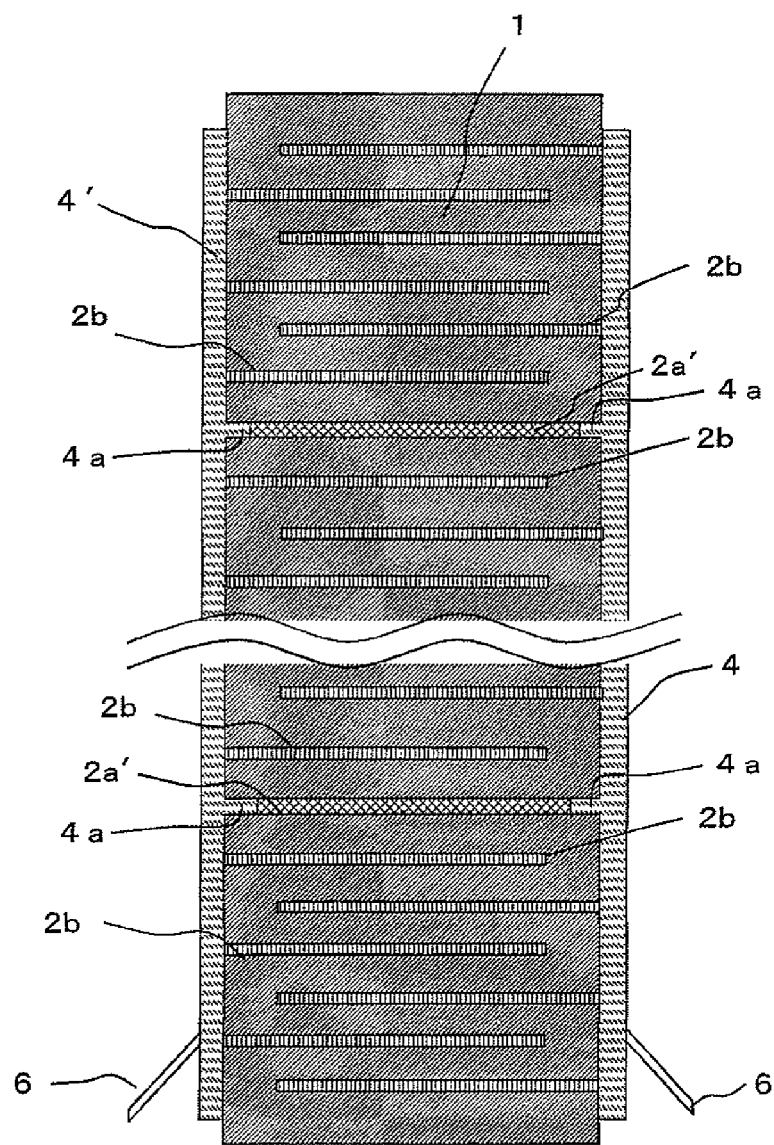
FIG. 8 is a sectional view (along a line perpendicular to the metal layer) of multi-layer piezoelectric element according to third embodiment.

FIG. 8 is a sectional view showing the multi-layer piezoelectric element according to the third embodiment of the present invention. As shown in FIG. 8, this device has a pair of external electrodes 4, 4' formed on side face S of the stack 10, while the infiltrating portion 4a is formed which is a part of one of the external electrodes 4 caused to infiltrate into a region between the two piezoelectric layers 1, and an infiltrating portion 4a' is formed which is the other external electrode 4' caused to infiltrate into another region between the two piezoelectric layers 1. This constitution makes it possible to prevent the external electrode from peeling off the side face of the stack and hence to improve the durability of the device further. Moreover, the constitution of forming two infiltrating portions in the same pair of piezoelectric layers decreases the manufacturing cost for forming the infiltrating portions compared to the case where one of the external electrodes is caused to infiltrate into a pair of piezoelectric layers and the other external electrode is caused to infiltrate into a different pair of piezoelectric layers, and therefore the device of high durability can be manufactured at a lower cost.

Fourth Embodiment

Figure 9:
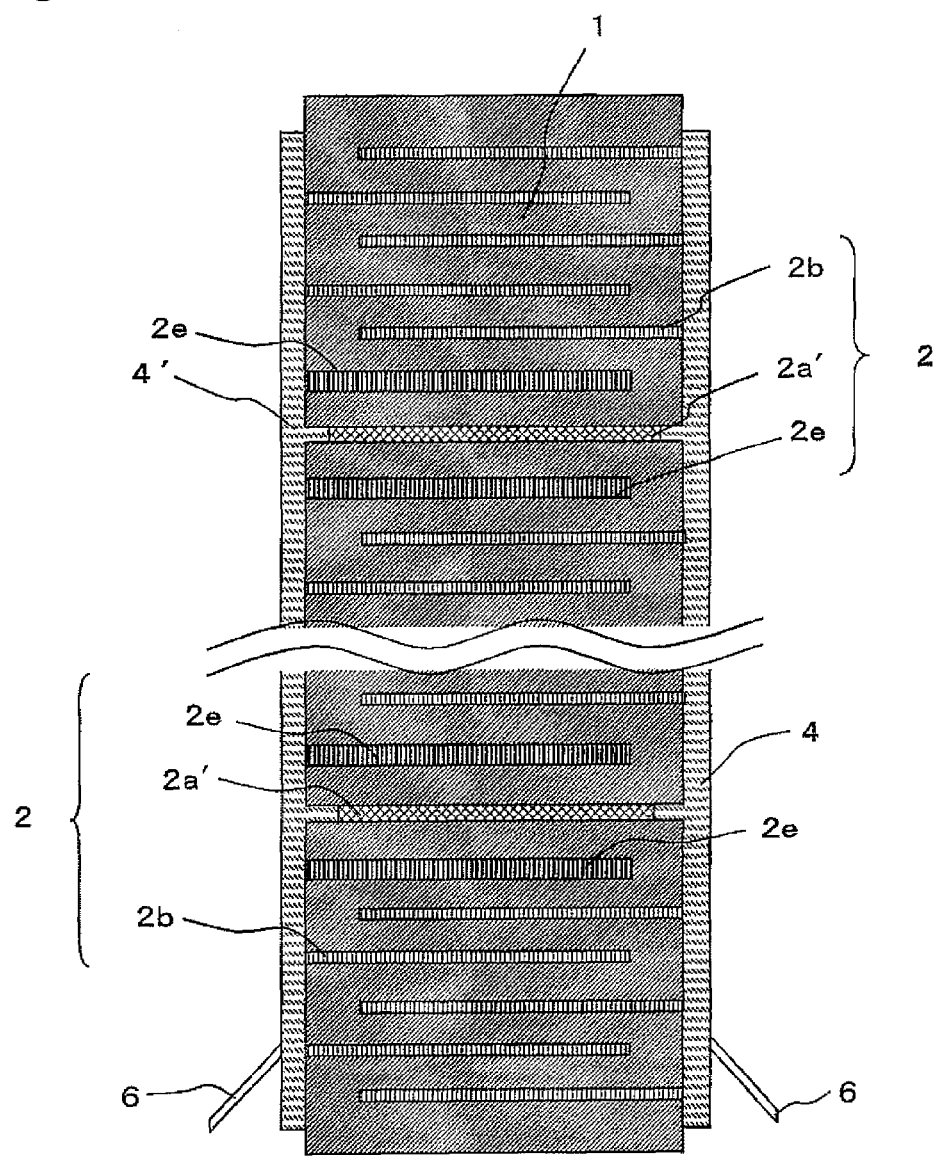
FIG. 9 is a sectional view (along a line perpendicular to the metal layer) of multi-layer piezoelectric element according to fourth embodiment.
Figure 10:
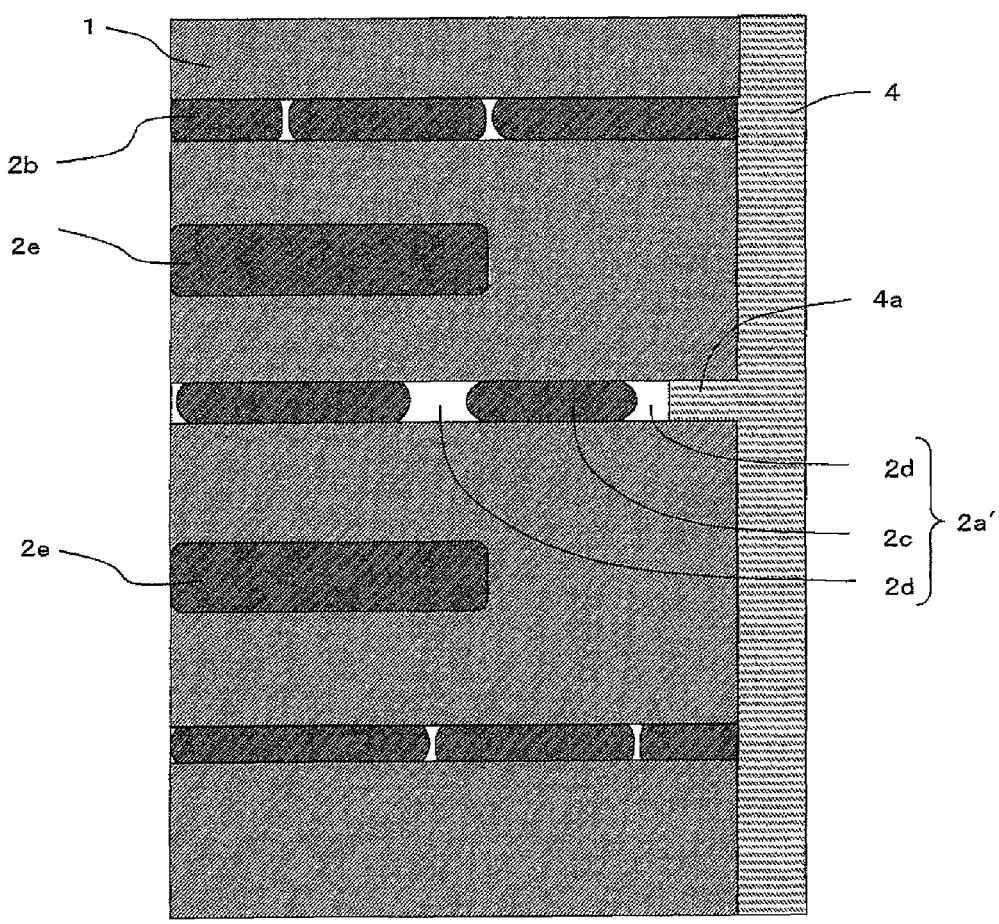
FIG. 10 is an enlarged sectional view of a junction between the external electrode and the side face of the stack in the fourth embodiment.

FIG. 9 is a sectional view showing the multi-layer piezoelectric element according to the fourth embodiment of the present invention. FIG. 10 is an enlarged sectional view of a junction between the external electrode 4 and side face S of the stack 10 in the fourth embodiment. As shown in FIG. 9 and FIG. 10, metal layers 2e, 2e provided on both sides in the stacking direction of the porous metal layer 2a' in the device of this embodiment are formed so as to include less voids than the metal layers (porous metal layer and the metal layer 2b) which adjoin the metal layer 2e in the stacking direction. Hereafter the metal layer 2e may also be referred to as high density metal layer 2e. The numbers of voids included in the high density metal layer 2e, the porous metal layer 2a' and the metal layer 2b may be compared by measuring the void ratio in each layer. Void ratio can be measured similarly to that described previously. In this embodiment, the high density metal layer 2e, 2e are formed with lower void ratio than that of the metal layers 2a', 2b located adjacent to these metal layers 2e, 2e in the stacking direction.

As the high density metal layer 2e, 2e are formed with lower void ratio than that of the metal layers 2a', 2b, contact area between the end of the high density metal layer and the external electrode increases, and therefore it becomes easier for the electrically conductive materials to diffuse between these members. This results in an increase in the bonding strength of the external electrodes through the diffusion bonding. Thus, anchoring effect is achieved by forming the infiltrating portion between the piezoelectric layers where the porous metal layer are disposed, and bonding strength is improved through the diffusion bonding between the metal layers which adjoin the porous metal layer and the external electrodes. When too many porous metal layers are provided for the purpose of increasing the bonding strength between the external electrode and the side face of the stack, strength of the device may decrease. However, bonding strength of the external electrode is increased while suppressing the strength of the device as a whole, by combining the anchoring effect by means of the porous metal layer and the diffusion bonding by means of the high density metal layer. Specifically, void ratio in the metal layer 2e is preferably not higher than 95%, more preferably not higher than 90% of the void ratio of the metal layer 2b.

The high density metal layer 2e, 2e of this embodiment are formed to be thicker than the metal layers 2a', 2b which adjoin these metal layers in the stacking direction. Since the metal layers 2e are thicker than the other metal layers 2a', 2b, it becomes easier for the electrically conductive materials to diffuse between the end of the high density metal layer 2e and the external electrode, and therefore the bonding strength of the external electrodes can be increased through the diffusion bonding. Thickness of the metal layer 2e is preferably not less than 105%, more preferably not less than 110% of the thickness of the metal layer 2b.

Fifth Embodiment

Figure 11:
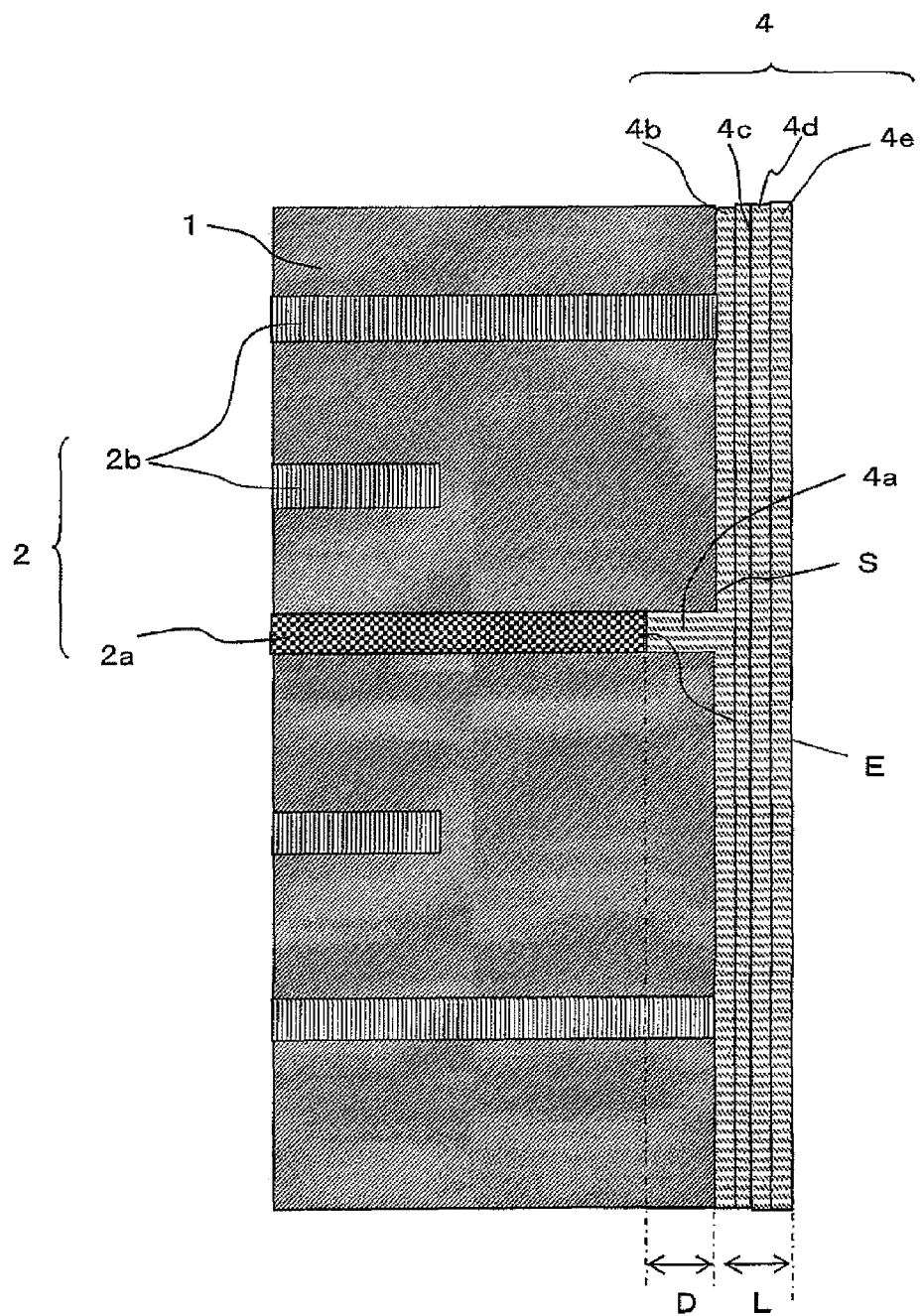
FIG. 11 is an enlarged sectional view of multi-layer piezoelectric element according to fifth embodiment.

FIG. 11 is a sectional view showing the multi-layer piezoelectric element according to the fifth embodiment of the present invention. As shown in FIG. 11, the external electrodes 4 of this embodiment comprise a plurality of layers 4b, 4c, 4d, 4e which are stacked in a direction perpendicular to the side face S of the stack 10. According to this embodiment, in case the external electrode 4 includes an electrically conductive material and a glass component and the content of the glass component in the infiltrating portion 4a is higher than in the portions (main body of the external electrode 4) other than the infiltrating portion 4a, the following effect is achieved. In a portion including much glass content, the glass component makes it easier for the metal to diffuse and form solid solution in the piezoelectric layer, thereby increasing the bonding strength of the infiltrating portion 4a and the piezoelectric layers which are in contact therewith. As a result, since the anchoring effect of the infiltration portion 4a is improved, bonding strength between the external electrode 4 and the stack 10 can be increased further.

Among the plurality of layers 4b through 4e, the layer 4b which is located on the side face S of the stack 10 is formed so as to include higher content of glass component than in the other layers 4c through 4e. Since this constitution makes it easier for the glass component to infiltrate between the adjacent piezoelectric layers, bonding strength between the external electrode 4 and the side face S of the stack 10 can be increased further. Since content of the glass component in the outer layer 4e, among the plurality of layers 4b through 4e that constitute the external electrodes 4, is set to be less than that in the layer 4b located on the side face S of the stack 10, bonding strength of the lead wires 6 which are soldered onto the external electrodes 4 can be increased. This is because the solder generally has lower wettability with the glass component.

The embodiments described above dealt with examples where the metal layers 2b, 2b (or metal layers 2e, 2e) disposed on both sides of the metal layer 2a (or metal layer 2a') in the stacking direction are of the same polarity. The constitution where the metal layers 2b, 2b (or metal layers 2e, 2e) are of the same polarity has the following advantages. In case the metal layer 2a' is constituted from a plurality of partial electrode layers 2c and voids 2d, and the partial electrode layers 2c are dispersed and are separated from each other, the metal layer 2a' does not function as an electrode. In this case, since the piezoelectric layer 1 which adjoins the metal layer 2a' is interposed between the metal layers 2b, 2b (or metal layers 2e, 2e) of the same polarity, the piezoelectric layer 1 does not undergo displacement when a voltage is applied to the external electrodes 4. This constitution enables it to prevent the stress from being concentrated in the metal layer 2a' comprising the plurality of partial metal layers 2c being dispersed. As a result, such a problem as a part of the external electrode 4 peels off the side face of the stack 10 can be prevented from occurring even when continuously operated over a long time under a high electric field and a high pressure.

Figure 12:
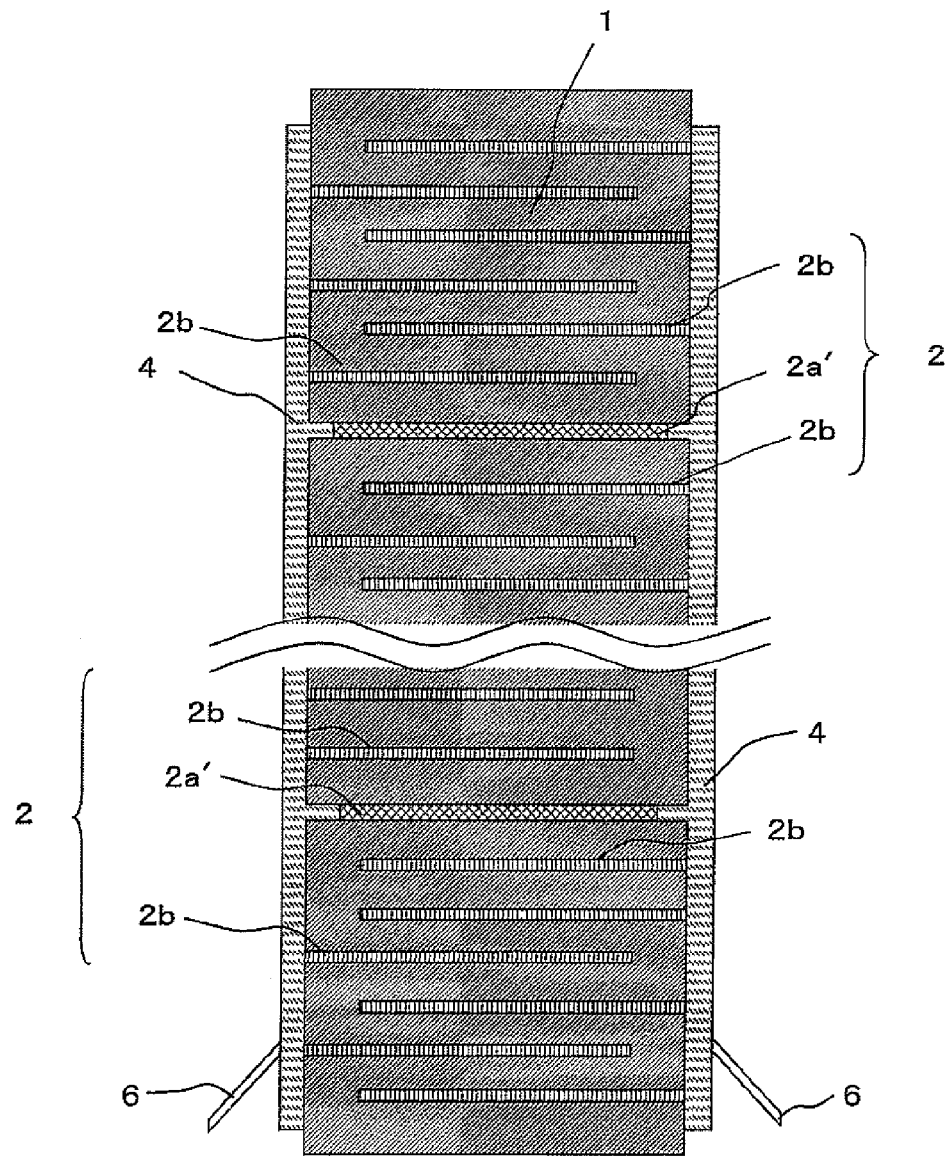
FIG. 12 is a sectional view of multi-layer piezoelectric element according to further another embodiment of the present invention.

A constitution where the metal layers 2b, 2b (or metal layers 2e, 2e) disposed on both sides of the metal layer 2a (or metal layer 2a') in the stacking direction are of different polarities (as shown in FIG. 12) have the following advantages. When the metal layer 2a' does not function as an electrode, the amount of displacement of the piezoelectric layer 1 interposed between the metal layers 2b, 2b (or metal layers 2e, 2e) located on both sides thereof becomes smaller than the amount of displacement of the piezoelectric layer 1 interposed between the other metal layers 2b, 2b. In case the piezoelectric layers 1 have the same thickness, the amount of displacement of the piezoelectric layer 1 interposed between the metal layers 2b, 2b (or metal layers 2e, 2e) located on both sides thereof is one half the amount of displacement of the piezoelectric layer 1 interposed between the other metal layers 2b, 2b. Thus the stress generated in the interface between the external electrode 4 and the metal layer 2 can be reduced. As a result, such a problem as a part of the external electrode 4 peels off the side face of the stack 10 can be prevented from occurring even when continuously operated over a long time under a high electric field and a high pressure.

(Manufacturing Method)

A method of manufacturing the multi-layer piezoelectric element of the present invention will now be described.

First, a calcined powder of a piezoelectric ceramic material constituted from perovskite type oxide consisting of PZT or the like, a binder made of an organic polymer such as acrylic resin or butyral resin and a plasticizer such as DBP (dibutyl phthalate) or DOP (dioctyl phthalate) are mixed to form a slurry. The slurry is formed into ceramic green sheets that would become the piezoelectric layers 1 by a known method such as doctor blade process or calender roll process or other tape molding method.

Then, a metal powder such as silver-palladium that would form the metal layer 2, a binder and a plasticizer are mixed, with calcined powder of the piezoelectric ceramic material added as required, to prepare an electrically conductive paste which would be used to form the metal layer 2, and is applied onto the top surfaces of the ceramic green sheets by screen printing method or the like to a thickness of 1 to 40 µm. The metal layer 2 having a desired thickness can be made by controlling the thickness of this film.

Then a plurality of the green sheets having the electrically conductive paste printed on the top surface thereof are stacked one on another, with the stack being heated at a predetermined temperature to remove the binder. The stack is then fired at a temperature in a range from 900 to 1,200° C. thereby to make the stack.

The metal layer 2 having an arbitrary void ratio can be formed, by making the electrically conductive paste used to form the metal layer 2 in such a composition that includes an organic material which is fastened when it is dry but evaporates when it is fired, such as acrylic beads. That is, void ratio in the metal layer 2 can be controlled by adjusting the quantity of the acrylic beads added to the electrically conductive paste. When the content of the acrylic beads is small, the void ratio becomes lower. When the content of the acrylic beads is larger, the void ratio becomes higher. Thus, a larger quantity of acrylic beads is added to the electrically conductive paste to form the metal layer 2 into which it is desired that a part of the external electrode 4 infiltrates, and a smaller quantity, or none at all, of acrylic beads is added to the electrically conductive paste to form the metal layer 2 into which it is desired that the external electrode 4 does not infiltrate.

If the metal powder such as silver-palladium that constitutes the metal layer 2 is added to the green sheet that forms the portion of the inactive layer 9, or if a slurry comprising the metal powder such as silver-palladium that constitutes the metal layer 2, an inorganic compound, a binder and a plasticizer is printed on the green sheet when stacking the green sheets that would become the inactive layer 9, shrinking behavior and shrinking rate can be matched between the inactive layer 9 and the other portions during sintering, and it is made possible to form the dense stack 10 with dense inner structure.

The method of making the stack 10 is not limited to that described above, and any manufacturing method may be employed as long as the stack 10 can be made in such a constitution as a plurality of the piezoelectric layers 1 and a plurality of the metal layers 2 are stacked alternately one on another.

Then, the fired stack is ground into a predetermined shape by using a known planar grinding machine or the like.

Then a electrically conductive silver-glass paste, prepared by mixing an electrically conductive powder including silver as main component, glass powder, a binder, a plasticizer and a solvent, is printed by screen printing or other method onto the side faces of the stack 10 whereon the external electrode 4 are to be formed. The stack is then fired at a predetermined temperature so as to form the external electrodes 4. The glass component is preferably glass which includes at least one of lead oxide and silicon oxide and has softening point not higher than 800° C., in order to obtain a high bonding strength with the piezoelectric layer 1 and cause it to effectively infiltrate into the metal layer 2. Besides such a glass, the glass component may be silica glass, soda-lime glass, lead alkali silicate glass, aluminoborosilicate glass, borosilicate glass, aluminosilicate glass, borate glass, phosphate glass, lead glass or the like.

The borosilicate glass, for example, may include 40 to 70% by weight of $SiO_2$, 2 to 30% by weight of $B_2O_3$, 0 to 20% by weight of $Al_2O_3$, 0 to 10% by weight in total of oxides of alkali earth metals such as MgO, CaO, SrO and BaO, and 0 to 10% by weight of alkali metal oxide. The borosilicate glass may include 5 to 30% by weight of ZnO. ZnO has an effect of lowering the processing temperature of borosilicate glass.

Phosphate glass may include 40 to 80% by weight of $P_2O_5$, 0 to 30% by weight of $Al_2O_3$, 0 to 30% by weight of $B_2O_3$, 0 to 30% by weight of ZnO, 0 to 30% by weight of oxides of alkali earth metals and 0 to 10% by weight of oxides of alkali metals.

The lead glass may include 30 to 80% by weight of PbO, 0 to 70% by weight of $SiO_2$, 0 to 30% by weight of $Bi_2O_3$, 0 to 20% by weight of $Al_2O_3$, 0 to 30% by weight of ZnO, 0 to 30% by weight of oxides of alkali earth metals and 0 to 10% by weight of oxides of alkali metals.

The electrically conductive material used to form the external electrodes preferably includes silver as the main component, in order to have resistance to oxidation and low Young's modulus and be low in cost. A trace of platinum or palladium may be added for the purpose of improving resistance to electro-migration.

The temperature at which the electrically conductive silver-glass paste is bonded by baking is preferably not lower than the softening point of the glass component included in the electrically conductive silver-glass paste and in a range from 500 to 800° C. for the purpose of causing a part of the external electrode 4 to infiltrate into the metal layer 2 and increase the bonding strength between the external electrodes 4 and the side face of the stack 10. Softening point of the glass component included in the electrically conductive silver-glass paste is preferably in a range from 500 to 800° C.

An electrical conductivity assisting member may be formed from an electrically conductive adhesive, including a metal mesh or a mesh-like metal sheet embedded therein, provided on the external surface of the external electrode 4. Providing the electrical conductivity assisting member on the external surface of the external electrode 4 makes it possible to supply a large current flowing through the electrical conductivity assisting member so as to decrease the current flowing in the external electrodes 4 when the actuator is driven by a large current to operate at a high speed. As a result, local heating which may lead to breakage of the external electrode 4 can be prevented from occurring, thereby significantly improving the durability.

The metal mesh or mesh-like metal sheet embedded in the electrically conductive adhesive also prevents cracks from occurring in the electrically conductive adhesive.

The metal mesh refers to a structure of entwined metal wires, and the mesh-like metal sheet refers to a metal sheet with a number of holes punched therethrough.

It is further preferable that the electrically conductive adhesive that constitutes the electrical conductivity assisting member is a polyimide resin including a silver powder dispersed therein. Use of the polyimide resin including a silver powder which has low resistivity dispersed therein makes it possible to form the electrical conductivity assisting member which maintains low resistivity and high bonding strength even when used at a high temperature.

The electrically conductive particles are preferably non-spherical particles having such shapes as flakes or acicular particles. When the electrically conductive particles are non-spherical particles such as flakes or acicular particles, the electrically conductive particles can be firmly entwined with each other, thereby increasing the shear strength of the electrically conductive adhesive.

Then the side faces of the stack 10 that include the external electrodes 4 are coated with a cladding resin formed from silicone rubber or the like by dipping process or the like. Connecting the lead wires 6 to the external electrodes 4 by soldering completes the multi-layer piezoelectric element of the present invention.

The multi-layer piezoelectric element of the present invention is not limited to those described above, and various modifications may be made within the scope of the present invention.

While the embodiments described above dealt with cases where the external electrodes 4 are formed on the opposing side faces of the stack 10, a pair of the external electrodes 4 may be formed on side faces which adjoin each other, for example, according to the present invention.

Sixth Embodiment

Simply covering the side faces of the stack with a cladding resin as in the case of the multi-layer piezoelectric actuator of the prior art may not achieve sufficient bonding between the cladding resin, the side faces of the stack and the metal layers. This may result in stress generated in the junction between the cladding resin and the side faces of the stack as the stack expands and contracts during continuous operation under a high electric field, leading to peel-off of the cladding resin from the side faces of the stack and from the ends of the metal layers, allowing moisture included in the atmosphere to enter the peeled portion. In such a case, silver migration may occur on the device surface because of the high electric field, which may adversely affect the function of the stack through short-circuiting between the metal layers.

Figure 30:
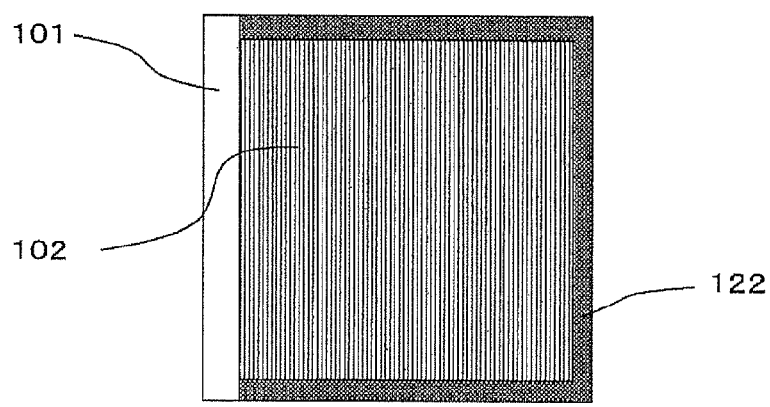
FIG. 30 is a sectional view along plane including the metal layer (internal electrode) in the multi-layer piezoelectric element of the prior art.

In such a constitution as shown in FIG. 30 where a recess is formed by removing the metal layer 102 by etching and the recess is filled with an insulating material 122 of an organic polymer, the cladding resin 121 cannot be surely prevented from peeling off during continuous operation under a high electric field, because the etching metal layer has a smooth surface and an insufficient bonding strength between the insulating material 122 of an organic polymer and the cladding resin 121 (refer to, for example, Japanese Unexamined Patent Publication (Kokai) No. 4-369277).

Figure 13:
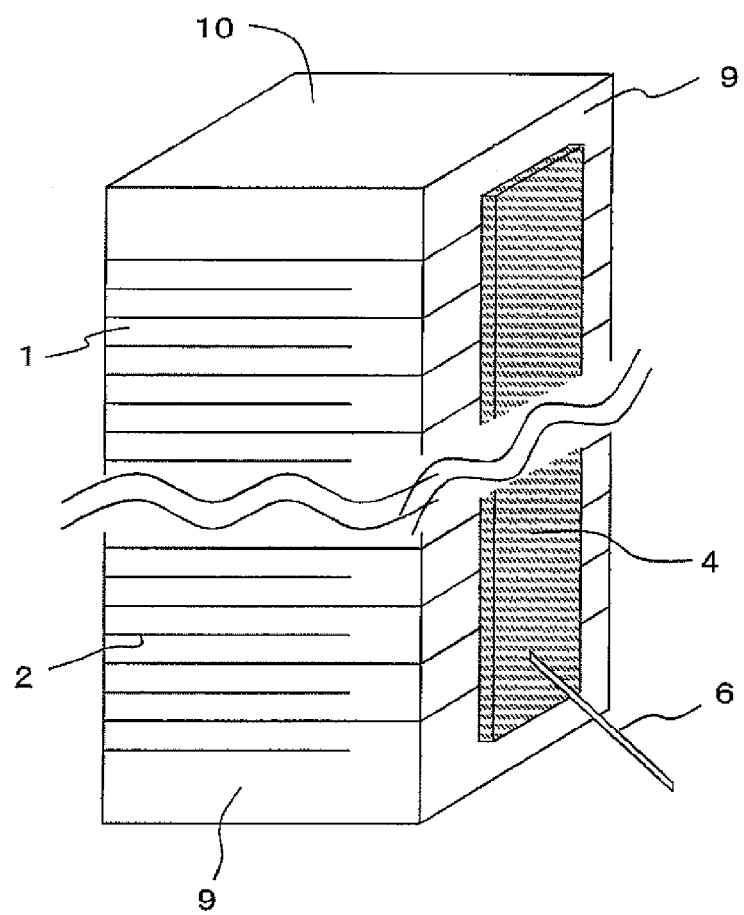
FIG. 13 is a perspective view of multi-layer piezoelectric element according to sixth embodiment before being covered with cladding resin (covering member).
Figure 14:
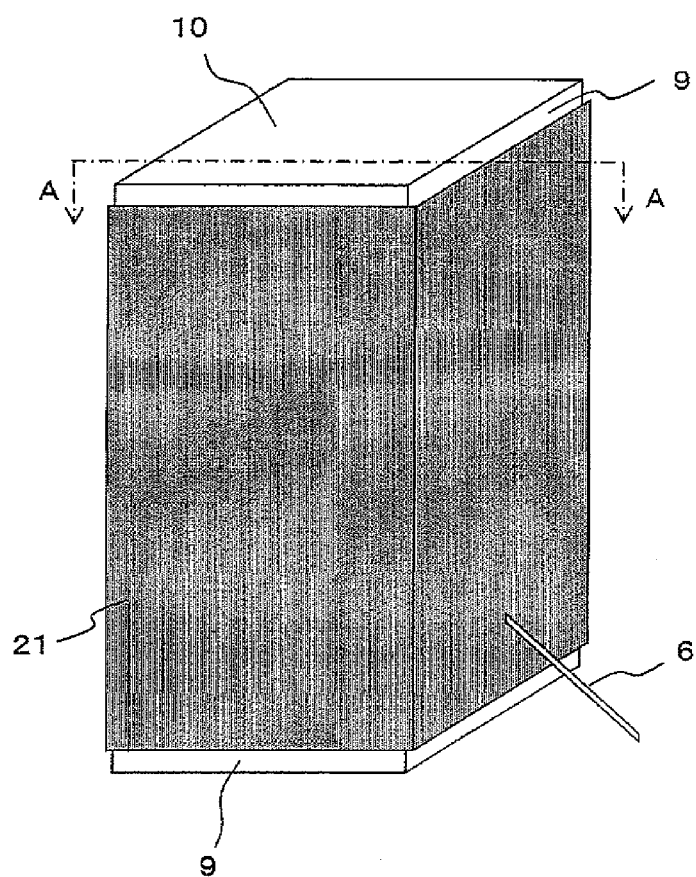
FIG. 14 is a perspective view of the multi-layer piezoelectric element according to the sixth embodiment covered with the cladding resin.
Figure 15:
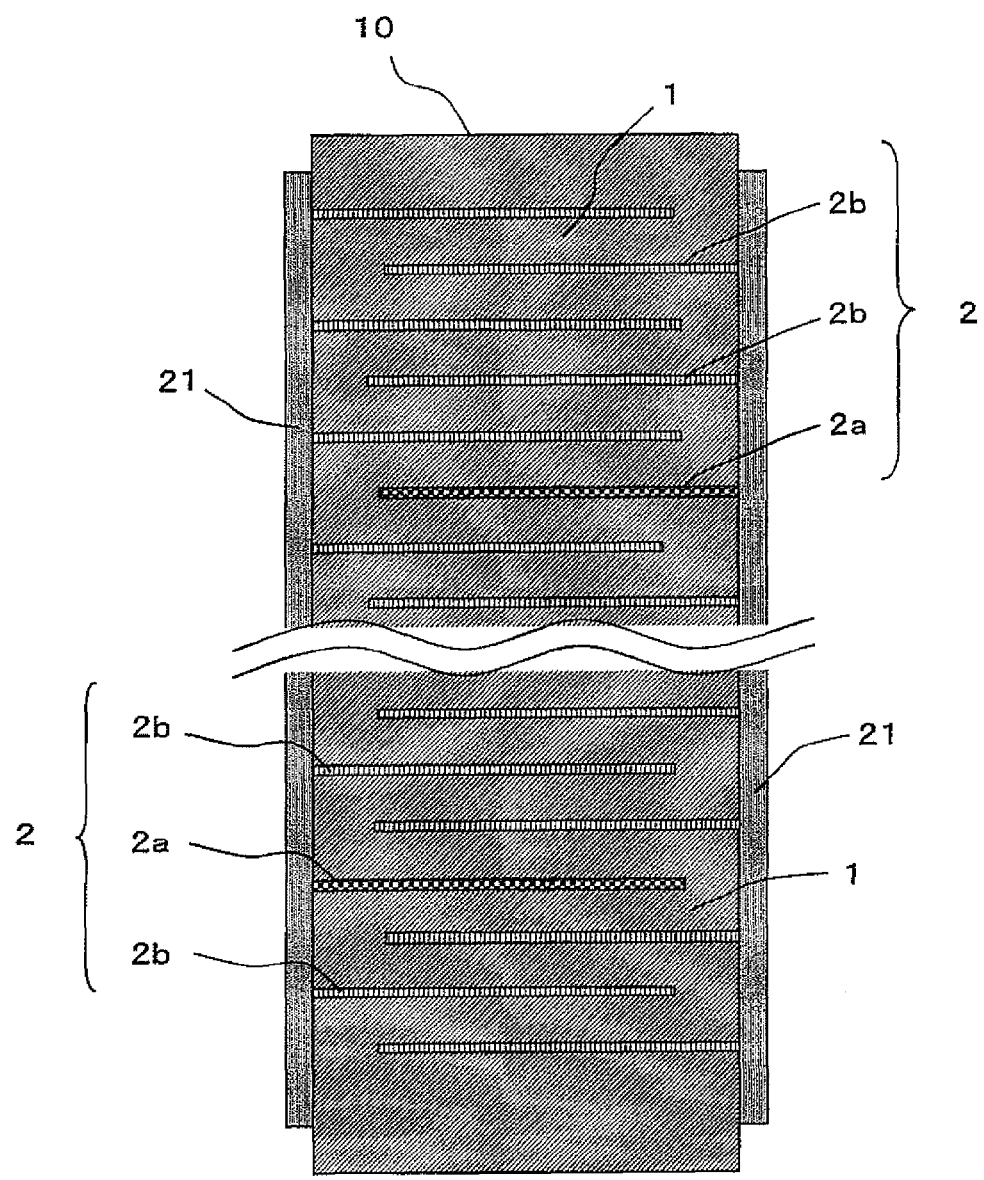
FIG. 15 is a sectional view taken along lines A-A in FIG. 14.
Figure 16:
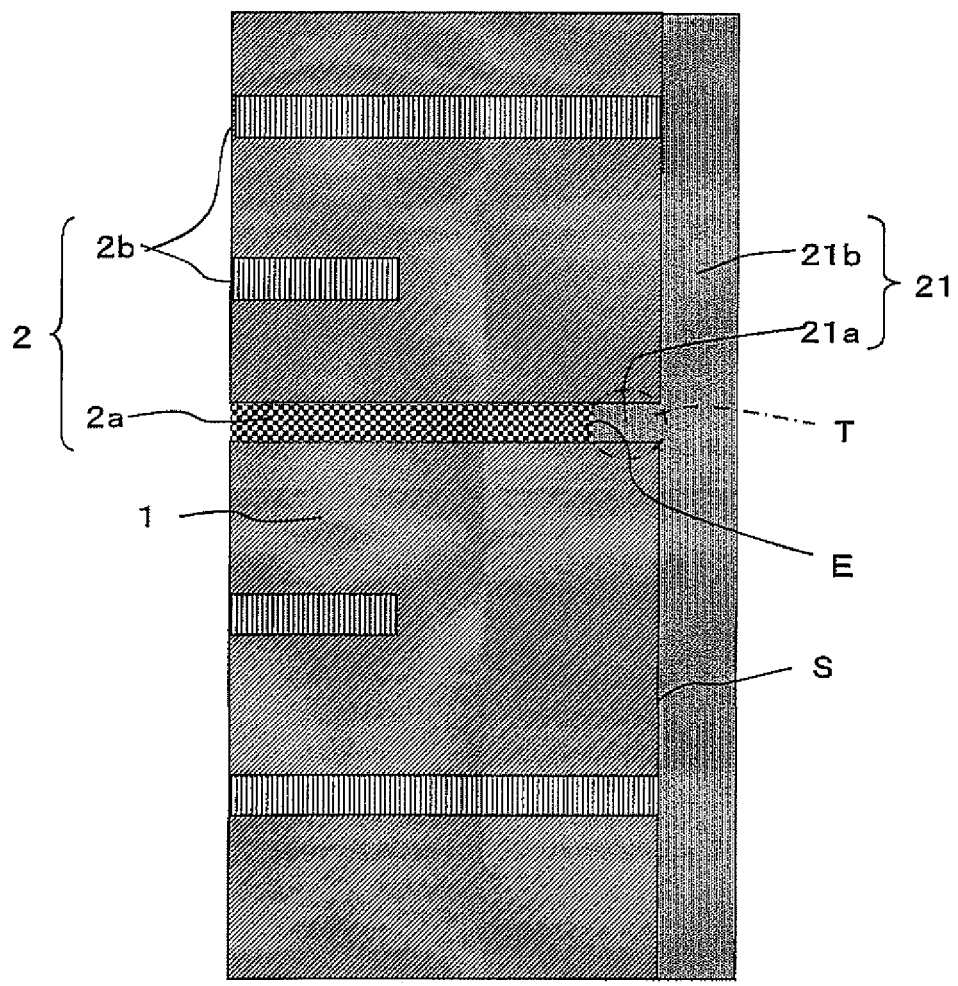
FIG. 16 is an enlarged sectional view of a junction between the cladding resin and the side face of the stack of the multi-layer piezoelectric element according to the fourth embodiment.
Figure 17:
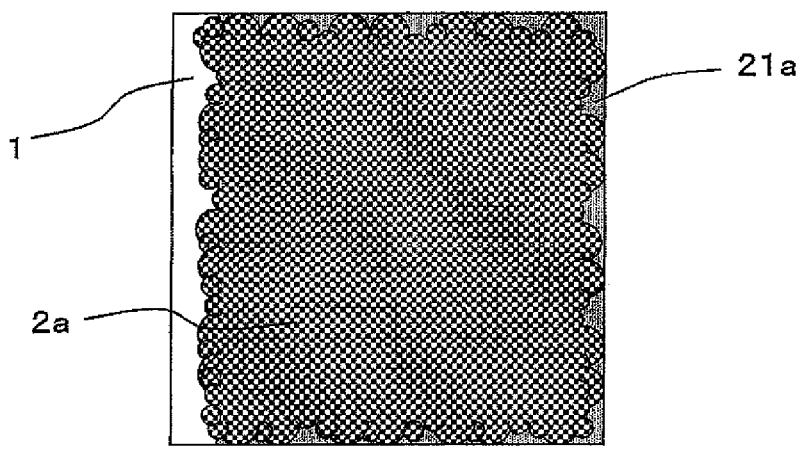
FIG. 17 is a sectional view along interface between the metal layer and the piezoelectric layer of the multi-layer piezoelectric element according to the sixth embodiment.

FIG. 13 is a perspective view of the multi-layer piezoelectric element according to the sixth embodiment of the present invention before being covered with a cladding resin (covering member). FIG. 14 is a perspective view of the multi-layer piezoelectric element according to the sixth embodiment covered with the cladding resin. FIG. 15 is a sectional view taken along lines A-A in FIG. 14. FIG. 16 is an enlarged sectional view of a junction between the cladding resin and the side face of the stack of the multi-layer piezoelectric element according to this embodiment. FIG. 17 is a sectional view along interface between the metal layer and the piezoelectric layer of the multi-layer piezoelectric element according to this embodiment.

As shown in FIG. 13 through FIG. 15, the multi-layer piezoelectric element of this embodiment comprises the stack 10 formed by stacking a plurality of piezoelectric layers 1 and a plurality of metal layers 2 alternately one on another, where a pair of the external electrodes 4 bonded on opposing side faces of the stack 10 electrically connect between the ends of the metal layers 2 in every other layer. Lead wires 6 are connected to the external electrodes 4 by soldering or the like. These lead wires 6 can be connected to an external voltage source (not shown). In the multi-layer piezoelectric element, as shown in FIG. 14 and FIG. 15, the side faces of the stack 10 and the external electrodes 4 are covered by a cladding resin 21.

As shown in FIG. 16 and FIG. 17, the multi-layer piezoelectric element of this embodiment is characterized in that a part of the cladding resin 21 (interior resin 21a) infiltrates into a part of the region between two adjacent piezoelectric layers 1. Specifically, the interior resin 21a which is a part of the cladding resin 21 infiltrates the region between the two adjacent piezoelectric layers 1 and region T disposed between the end E of the metal layer 2a and the side face S of the stack 10. The interior resin 21a that infiltrates into the region T is integral with the main body 21b of the cladding resin 21 which is bonded onto the side faces S of the stack 10. The phrase "integral with" means not only the interior resin 21a is in contact with the main body 21b of the cladding resin 21, but the interior resin 21a is connected with the main body 21b of the cladding resin 21.

In the constitution described above where the interior resin 21a which is a part of the cladding resin 21 infiltrates into the region T between the piezoelectric layers 1 and is integrated with the cladding resin body 21b, such a structure is obtained as piles are driven into the stack 10 through the side faces S thereof, thus providing the anchoring effect that significantly improves bonding strength between the cladding resin 21 and the stack 10. As a result, it is made possible to prevent the covering member 21 from peeling off the side face of the stack 10 even when the multi-layer piezoelectric element is continuously operated over a long time under a high electric field and a high pressure.

The stress generated in the interface between the cladding resin and the stack when the stack expands and contracts during operation propagates to the piezoelectric layers 1 through the interior resin 21a which infiltrates into the region T. Crystal structure of the piezoelectric material that makes contact with the interior resin 21a which infiltrates into the region T changes depending on the stress which has propagated, so as to absorb the stress.

Since the main component of the interior resin 21a is a resin, the resin not only deforms to mitigate the stress but also covers the piezoelectric material that makes contact with the interior resin 21a, the resin can absorb the volumetric change of the piezoelectric material due to the change in the crystal structure, so as to suppress stress from being newly generated.

Further, in a portion where the piezoelectric layer 1 faces the void, the piezoelectric material is oxidized or reduced depending on the oxygen concentration and temperature of the surrounding atmosphere, giving rise to the possibility of the piezoelectric characteristic changing during a long period of use of the multi-layer piezoelectric element. However, the interior resin 21 is capable of mitigating the influence of the operating environment. As a result, the piezoelectric material has highly durable stress relieving function, so that the multi-layer piezoelectric element of long service life with improved reliability of bonding between the covering member and the stack is obtained.

The depth D to which the interior resin 21a that is a part of the cladding resin 21 residing in the region T infiltrates the region T between the end E of the metal layer 2a and the side face S of the stack 10 is 1 μm or larger, and preferably 5 μm or larger in order to increase the bonding strength. When depth D is 1 μm or larger, sufficient anchoring effect is achieved so as to obtain sufficient bonding strength between the cladding resin 21 and the side faces of the stack 10.

It is also preferable that there are a plurality of the regions T between the piezoelectric layers 1 wherein the part of the cladding resin 21 infiltrates, and that these regions T are disposed in an ordered arrangement in the stacking direction of the piezoelectric layers 1. With such a constitution where the regions T wherein the interior resin 21a infiltrates are disposed in an ordered arrangement in the stacking direction, the external electrodes 21 are bonded firmly and substantially uniformly over the entire length in the stacking direction of the stack 10.

It is preferable that the plurality of regions T are provided in a ratio of one for every group of metal layers 2 not less than one half the total number thereof included in the stack 10, more preferably one for every group of metal layers 2 not less than one eighth of the total number, and most preferably one for every group of metal layers 2 not less than one fifteenth of the total number. When the regions T are provided in a ratio of one for every group of more metal layers 2 than one half the total number of the metal layers 2, the small proportion of the regions T may result in uneven bonding strength of the external electrodes 21 over the entire length in the stacking direction of the stack 10. While the regions T are preferably disposed in a substantially ordered arrangement in the stacking direction of the stack 10, the regions T may also be placed near the ends of the stacking direction without following the rule of the same intervals applied to the mid portion of the stack 10.

The phrase that the regions T are "disposed in ordered arrangement" means not only a case where the plurality of regions T are disposed at equal intervals, but also a case where the regions T are disposed at similar intervals to such an extent as the external electrodes 21 can be firmly boned substantially uniformly over the entire length in the stacking direction of the stack 10. Specifically, it is preferable that the spacing between any adjacent infiltrating portions 4a is within ±20%, more preferably ±15% of the mean interval between infiltrating portions 4a and most preferably the same.

While the metal layer 2b other than the metal layer 2a is provided between two regions T in which the metal layer 2a infiltrates, it is preferable that a plurality of the metal layers 2b are provided, and it is more preferable that the number of the metal layers 2b of positive polarity and the number of the metal layers 2b of negative polarity are equal. In this constitution, the cladding resin 21 located on the positive side and the cladding resin 21 located on the negative side infiltrate evenly into the metal layer 2a, so that the cladding resin 21 located on the positive side and the cladding resin 21 located on the negative side can be firmly bonded to the stack 10 in a well-balanced manner.

In the multi-layer piezoelectric element of this embodiment, main component of the metal element 2a disposed between the piezoelectric layers 1 where the interior resin 21a, which is a part of the cladding layer 21, infiltrates is preferably at least one kind selected from among the metals of group 8 to group 11 of the Periodic Table. Forming the metal layer 2a mainly from such component makes it possible to fire the piezoelectric layers 1 and the metal layers 2a at the same time, so as to firmly bond the piezoelectric layers 1 and the metal layers 2a. Even when the metal layer 2a receives a stress generated by the displacement of the piezoelectric element, the stress would not be concentrated since the metal layer 2a is formed from the metal that is pliant enough to expand and contract, thus making it possible to provide the multi-layer piezoelectric element having high durability. It is particularly preferable that the metal element that constitutes the metal electrode 2a is an alloy consisting of at least one kind selected from among Ni, Pt, Pd, Rh, Ir, Ru and Os which are metals of group 8 to group 10 of the Periodic Table, and at least one kind selected from among Cu, Ag and Au which are metals of group 11 of the Periodic Table. This is because such a metal composition is advantageous in volume production when the alloy powder synthesizing technology available today is employed. The metal element that constitutes the metal electrode 2s may also be a metal element of group 11 of the Periodic Table.

It is also preferable that the metal layer 2 is formed mainly from metals of group 11 of the Periodic Table, and the metal layer 2a disposed between the piezoelectric layers 1 where the interior resin 21a has higher proportion of the metals of group 11 of the Periodic Table than the other metal layers 2b than the metal layer 2a. This makes it possible to fire the piezoelectric layers 1 and the metal layers 21, 2b at the same time. By setting the proportion of metals of group 11 of the Periodic Table such as copper, silver or gold having low Young's modulus higher in the metal layer 2a than in the metal layer 2b, it is made possible to keep the Young's modulus of the metal layer 2a which adjoins the region T in which the interior resin 21a infiltrates at a relatively low level. As a result, the metal layer 2a can effectively absorb the strain caused by the expansion and contraction of the stack 10 during operation, thereby decreasing the stress caused by the expansion and contraction of the stack 10 in the cladding resin 21 which are firmly bonded onto the side face of the stack 10. As a result, such trouble can be prevented from occurring that the covering member 21 peels off the side face of the stack 10 when continuously operated over a long time under a high electric field and a high pressure.

The cladding resin 21 preferably includes at least one kind selected from the group consisting of silicone resin, epoxy resin, polyimide resin, fluorocarbon resin, urethane resin, polyamideimide resin, acrylic resin, nylon resin and polyester resin. It is preferable that the interior resin 21a also includes at least one kind selected from among the group described above.

The piezoelectric layer 1 is formed from a piezoelectric ceramic material such as lead titanate zirconate Pb(Zr—Ti)O$_3$ (hereinafter abbreviated to PZT) or barium titanate BaTiO$_3$ as the main component. The piezoelectric ceramic material preferably has a high value of piezoelectric strain constant d$_{33}$ which represents the piezoelectric characteristic.

The piezoelectric layer 1 preferably has a dimension of 40 to 250 μm in thickness, namely the distance between the metal layers 2. With this dimension, a compact multi-layer piezoelectric actuator with low profile can be provided where insulation breakdown can be prevented from occurring in the piezoelectric layers 1, even when a larger number of the piezoelectric layers are stacked in order to achieve a larger amount of displacement of the multi-layer piezoelectric element.

Seventh Embodiment

Figure 18:
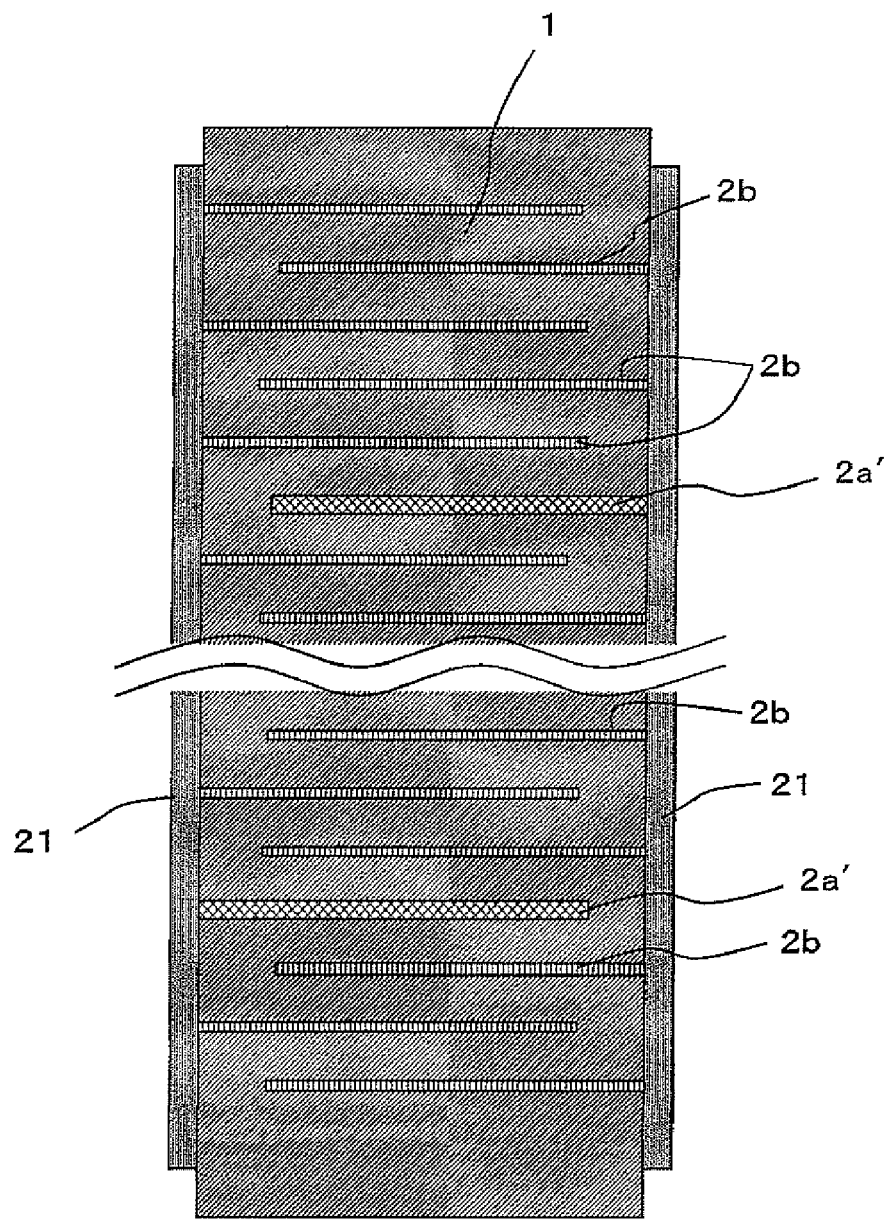
FIG. 18 is a sectional view of multi-layer piezoelectric element according to seventh embodiment.
Figure 19:
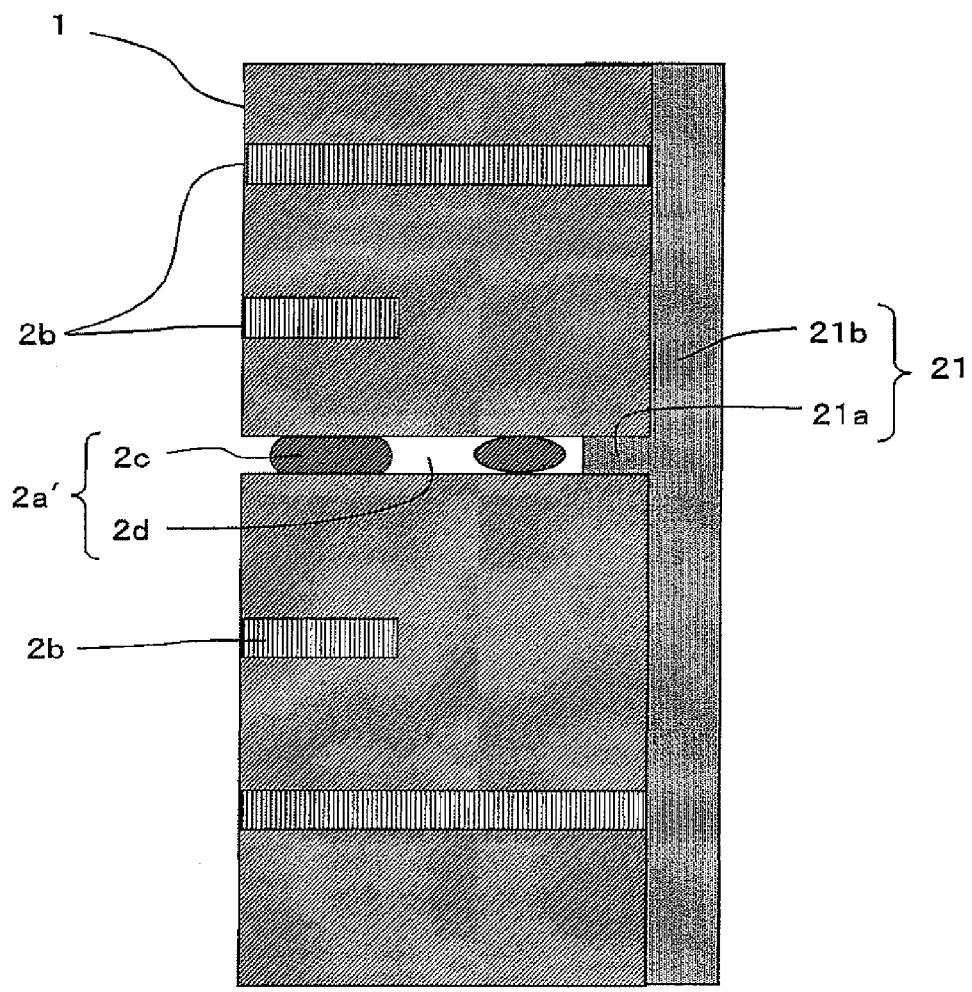
FIG. 19 is an enlarged sectional view of a junction between the cladding resin 21 and the side face of the stack 10 of the multi-layer piezoelectric element according to the seventh embodiment.

FIG. 18 is a sectional view showing the multi-layer piezoelectric element according to the seventh embodiment of the present invention. FIG. 19 is an enlarged sectional view of a junction between the cladding resin 21 and side face of the stack 10 in the seventh embodiment. As shown in FIG. 18 and FIG. 19, the multi-layer piezoelectric element of the seventh embodiment is characterized in that some metal layers 2a' among the plurality of metal layers 2 are porous metal layer 2a' where more voids 2d are included than in the metal layers 2b provided on both sides adjacent to the metal layers 2a', and a part of the cladding resin 21 (interior resin 21a) infiltrates in a part of the voids 2d. By forming such a constitution as part of the porous metal layer 2a' consists of the partial metal layer 2c and the voids 2d and the porous metal layer 2a' includes more voids 2d than in the adjacent metal layers 2b disposed on both sides, it is made possible to cause the component of the cladding resin 21 to infiltrate deeper into the porous metal layer 2a' which includes more voids 2d, and more effectively increase the bonding strength between the external electrode and the side face of the stack. The term "void" refers to a portion where there is no metal in the region between the piezoelectric layers 1. Accordingly, a space filled with the interior resin 21a is also called the void for convenience.

Void ratio in the porous metal layer 2a' is preferably in a range from 10 to 95%, more preferably from 40 to 90%, in order to cause the cladding resin 21 to effectively infiltrate into a part of the voids 2d. When the void ratio is 10% or higher, the part of the cladding resin 21 can effectively infiltrate so as to achieve sufficient bonding strength between the cladding resin 21 and the side face of the stack 10. This makes it possible to prevent the covering member 21 from peeling off the side face of the stack 10. In case the void ratio is 90% or lower, bonding strength between the metal layer 2a' and the piezoelectric layers 1 disposed on both sides thereof is prevented from decreasing, so that peel-off or other trouble do not occur during firing. Void ratio is a proportion of voids to the total area of the porous metal layer 2a', measured in a section parallel to the stacking direction of the porous metal layer 2a'. The same applies to the void ratio in the metal layer 2a and the metal layer 2b.

Figure 20:
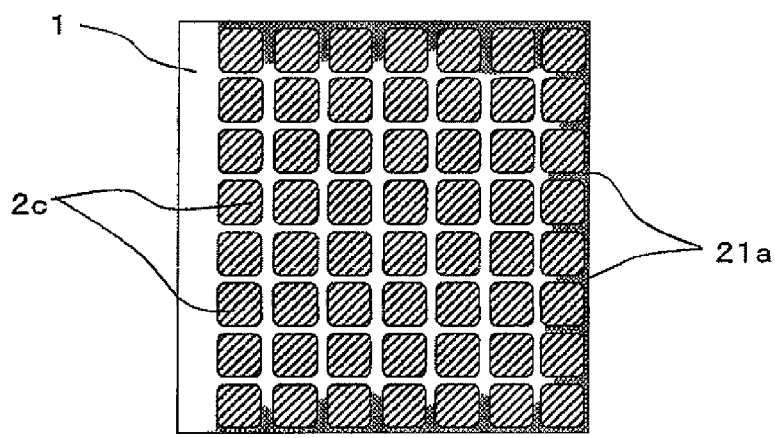
FIG. 20 is a sectional view along the interface between the metal layer and the piezoelectric layer of the multi-layer piezoelectric element according to the seventh embodiment.
Figure 21:
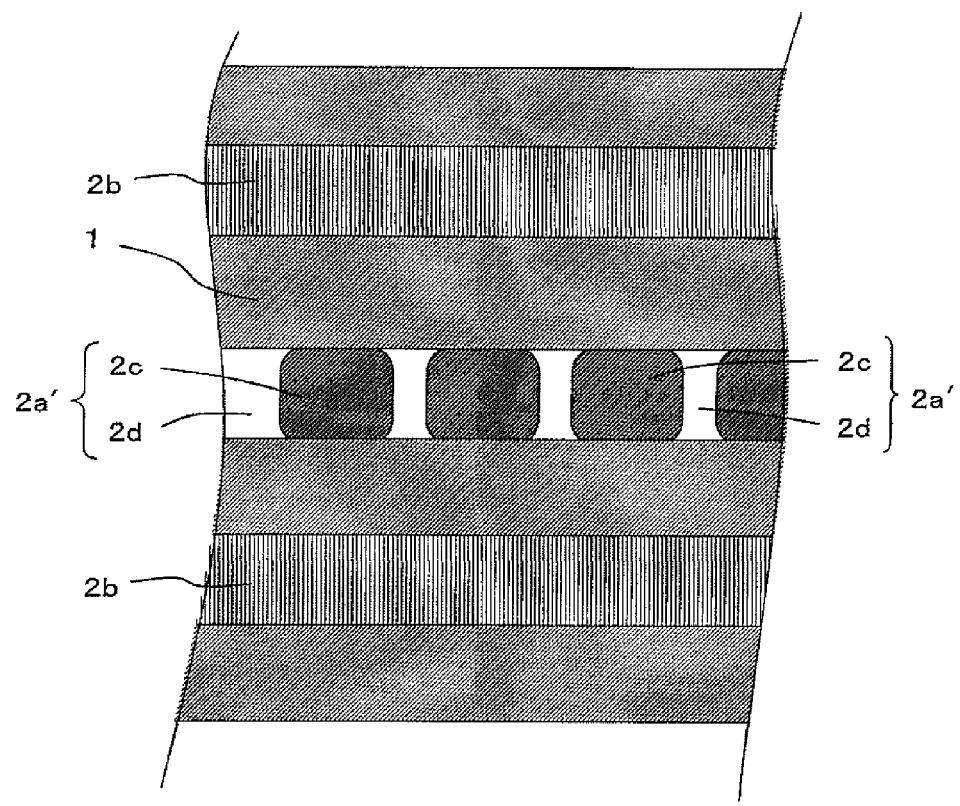
FIG. 21 is an enlarged sectional view of a portion around the metal layer in the multi-layer piezoelectric element according to the seventh embodiment.
Figure 22:
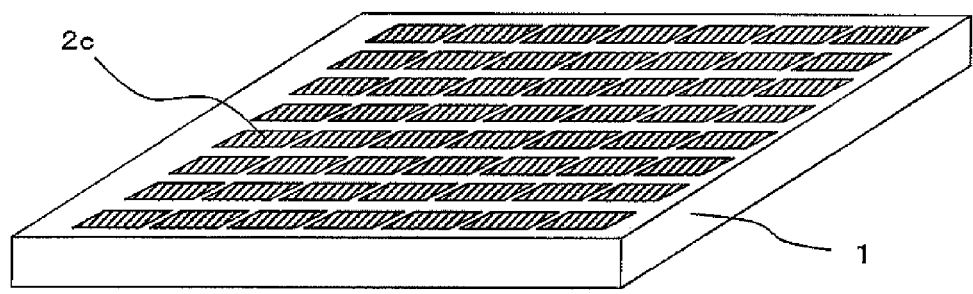
FIG. 22 is a perspective view showing the arrangement of the partial metal layers disposed on piezoelectric layer in the seventh embodiment.

FIG. 20 is a sectional view along the interface between the metal layer and the piezoelectric layer of the multi-layer piezoelectric element according to the seventh embodiment. FIG. 21 is an enlarged sectional view of a portion around the metal layer in the multi-layer piezoelectric element according to the seventh embodiment. FIG. 22 is a perspective view showing the arrangement of partial metal layers on the piezoelectric layer in the seventh embodiment. As shown in FIGS. 20 through 22, in the multi-layer piezoelectric element of the seventh embodiment, the metal layer 2a' is preferably constituted from a plurality of partial metal layers 2c (partial metal layers distributed like islands) which are dispersed. A part of the cladding resin 21 infiltrates into a part of the space between the plurality of partial metal layers 2c which are dispersed. In this way, the cladding resin 21 infiltrates through capillary effect into the metal layers 2c which are distributed like islands when the side faces of the stack 10 are coated with the cladding resin 21. As a result, the multi-layer piezoelectric element having the cladding layer 21 that effectively infiltrates into the porous metal layer 2a' can be made. Thus, the cladding resin 21 can be firmly bonded onto the side faces of the stack 10, and such trouble can be prevented from occurring that the covering member 21 peels off the side face of the stack 10 when continuously operated over a long time under a high electric field and a high pressure.

The metal-filling ratio in the porous metal layer 2a' in the state of having the plurality of partial metal layers 2c dispersed is preferably in a range from 5 to 55%, more preferably from 10 to 40%. When the metal-filling ratio is 5% or higher, bonding strength between the metal layer 2a' and the adjacent piezoelectric layer 1 can be prevented from decreasing. When the metal-filling ratio is 55% or lower, the metal layer 2a' becomes more likely to take such a form that a plurality of metal portions are distributed like islands, so that capillary phenomenon becomes easier to occur when the cladding resin 21 is provided as coating. This enables it to cause the cladding resin 21 to infiltrate more effectively into the metal layer 2a'. Thus controlling the metal-filling ratio in a range from 5 to 55% makes it possible to maintain a high level of bonding strength between the metal layer 2a and the piezoelectric layer 1, cause the cladding resin 21 to infiltrate more effectively into the metal layer 2a through capillary effect when the cladding resin 21 is provided as the coating to bond onto the side faces of the stack 10, and increase the bonding strength between the side faces of the stack 10 and the metal layer 2a. The metal-filling ratio is a proportion of the area occupied by the metal composition to the total area of the metal layer 2a', measured in a section parallel to the stacking direction of the metal layer 2a'.

Size of the partial metal layers 2c dispersed over the metal layer 2a' is preferably in a range from 1 to 100 μm. When size of the partial metal layers 2c is 1 μm or larger, the metal layer 2a' will not become too thin and the part of the cladding resin 21 can be caused to effectively infiltrate into the metal layer 2a. When size of the partial metal layers 2c is not larger than 100 μm, the metal layer 2a' can disperse and absorb the strain caused by the expansion and contraction of the stack 10 during operation, so as to prevent the stress from concentrating in the metal composition and prevent cracks from occurring in the piezoelectric layers 1. Thus, by setting the size of the partial metal layers 2c which are dispersed over the metal layer 2a in the range from 1 to 100 μm, it is made possible to cause a part of the cladding resin 21 to infiltrate into the metal layer 2a and have the stress generated by the expansion and contraction of the stack 10 diffused and absorbed by the metal layer 2a. The size of the partial metal layers 2c dispersed over the metal layer 2a' is more preferably in a range from 3 to 50 μm. The partial metal layers 2c may have substantially spherical or any other shape.

In case the metal layer 2a', into which the interior resin 21a that is a part of the cladding layer 21 infiltrates, is in such a state as a plurality of partial metal layers 2c are dispersed, then the layer is allowed to be in a state of without electrical continuity unable to function as an electrode. In such a case, the metal layer 2a' may be either formed partially with respect to the piezoelectric layer 1 (the so-called partial electrode structure), or formed over the entire surface.

The present invention applies not only to the case of the embodiment described above where the interior resin is a part of the cladding resin, but also to a case where the interior resin is formed from a component different from that of the cladding resin. However, from the view point of the bonding strength between the interior resin and the cladding resin, it is preferable that the interior resin is formed from the same component as that of the cladding resin, and it is more preferable that the interior resin is a part of the cladding resin.

(Manufacturing Method)

A method of manufacturing the multi-layer piezoelectric element of the present invention will now be described.

First, a calcined powder of a piezoelectric ceramic material constituted from perovskite type oxide consisting of $PbZrO_3$—$PbTiO_3$ or the like, a binder made of an organic polymer such as acrylic resin or butyral resin and a plasticizer such as DOP (dioctyl phthalate) or DBP (dibutyl phthalate) are mixed to form a slurry. The slurry is formed into ceramic green sheets that would become the piezoelectric layers 1 by a known method such as doctor blade process or calender roll process or other tape molding method.

Then a metal powder such as silver-palladium that would form the metal layer 2, a binder and a plasticizer are mixed, with calcined powder of the piezoelectric ceramic material added as required, to prepare an electrically conductive paste which would be used to form the metal layer 2, and is applied onto the top surfaces of the ceramic green sheets by screen printing method or the like to a thickness of 1 to 40 µm.

Then a plurality of the green sheets having the electrically conductive paste printed on the top surface thereof are stacked one on another, with the stack being heated at a predetermined temperature to remove the binder. The stack is then fired at a temperature in a range from 900 to 1,200° C. thereby to make the stack.

The metal layer 2 having a desired void ratio can be formed, by preparing the electrically conductive paste used to form the metal layer 2 in such a composition that includes an organic material which is fastened when it is dry but evaporates when it is fired, such as acrylic beads. That is, void ratio in the metal layer 2 can be controlled by adjusting the quantity of acrylic beads added to the electrically conductive paste. When the content of the acrylic beads is small, the void ratio becomes lower. When the content of the acrylic beads is larger, the void ratio becomes higher. Thus a larger quantity of acrylic beads is added to the electrically conductive paste to form the metal layer 2 into which it is desired that a part of the cladding resin 21 infiltrates, and a smaller quantity, or none at all, of acrylic beads is added to the electrically conductive paste to form the metal layer 2 into which it is desired that the cladding resin 21 does not infiltrate.

If the metal powder such as silver-palladium that constitutes the metal layer 2 is added to the green sheet that forms the inactive layer 9, or if a slurry comprising the metal powder such as silver-palladium that constitutes the metal layer 2, an inorganic compound, a binder and a plasticizer is printed on the green sheet when stacking the green sheets that would become the inactive layer 9, shrinking behavior and shrinking rate can be matched between the inactive layer 9 and the other portions during sintering, and it is made possible to form the dense stack 10 with dense inner structure.

The method of making the stack 10 is not limited to that described above, and any manufacturing method may be employed as long as the stack 10 can be made in such a constitution as a plurality of the piezoelectric layers 1 and a plurality of the metal layers 2 are stacked alternately one on another.

The external electrodes 4 can be formed by the method described previously. The glass component and the electrically conductive material that constitutes the external electrodes may be the same as those described above. The temperature at which the electrically conductive silver-glass paste is bonded by baking is preferably in a range similar to that described previously. An electrical conductivity assisting member may be formed from an electrically conductive adhesive, including a metal mesh or a mesh-like metal sheet embedded therein, provided on the external surface of the external electrode 4.

Then the lead wires 6 are connected to the external electrodes 4 by soldering or the like, and the side faces of the stack 10 that include the external electrodes 4 are coated with the cladding resin formed from a silicone rubber by dipping process or the like, so as to complete the multi-layer piezoelectric element of the present invention. It is preferable that the metal layer is constituted from a plurality of dispersed partial metal layers in order to cause the cladding resin 21 to infiltrate into a part of the region between the adjacent piezoelectric layers 1 by making use of the capillary effect, and it is more preferable to carry out vacuum sucking after the dipping process. More preferably, viscosity of the cladding resin 21 is controlled to become lower before the dipping process, which makes it easier for the capillary effect to occur and cause the cladding resin 21 to infiltrate into the region. Such a manufacturing method makes it possible to cause a part of the interior resin 21a that covers the side faces of the stack 10 to infiltrate into the region T so as to become the interior resin 21a and is integrated with the main body 21b of the cladding resin 21.

The multi-layer piezoelectric element of the present invention is not limited to that described above, and various modifications may be made within the scope of the present invention. While the embodiment described above dealt with cases where the external electrodes 4 are formed on the opposing side faces of the stack 10, a pair of the external electrodes 4 may be formed on adjacent side faces, for example, according to the present invention.

Eighth Embodiment

Figure 23:
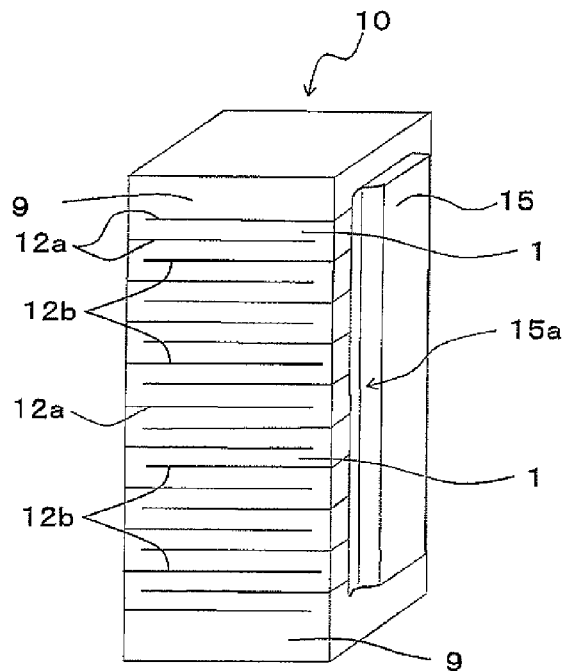
FIG. 23 is a perspective view of multi-layer piezoelectric element according to eighth embodiment.
Figure 24:
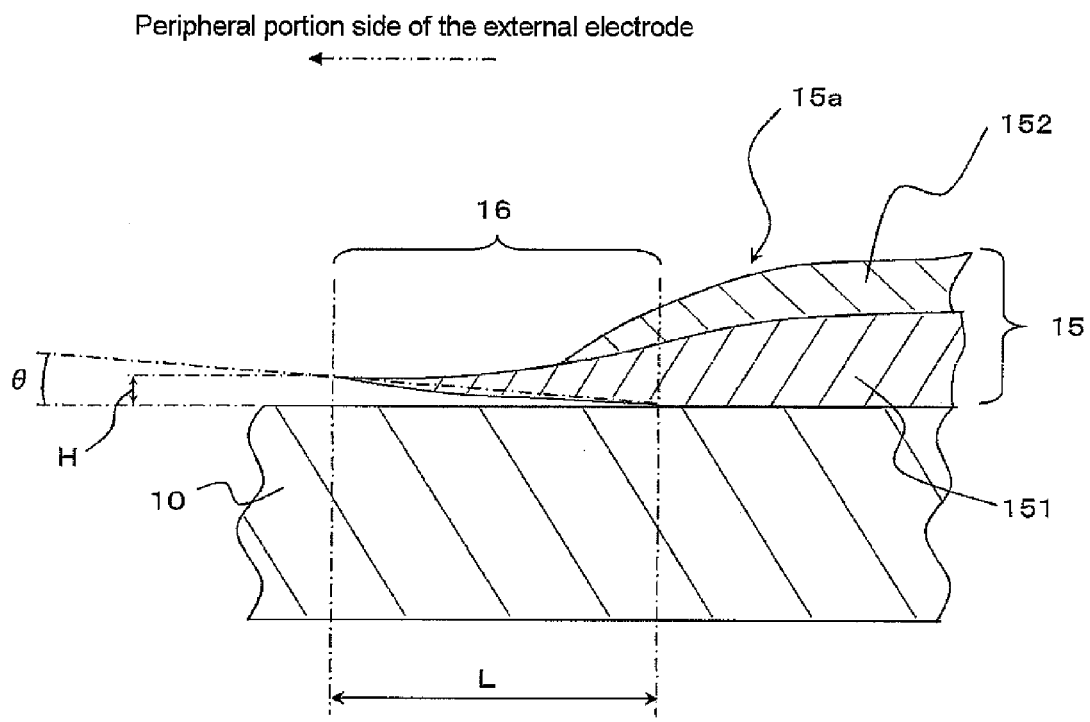
FIG. 24 is an enlarged sectional view of an example of junction between the piezoelectric layer and the external electrode in FIG. 23.

FIG. 23 is a perspective view of the multi-layer piezoelectric element according to the eighth embodiment. FIG. 24 is an enlarged sectional view of a junction between the piezoelectric layer and the external electrode in FIG. 23.

As shown in FIG. 23, the multi-layer piezoelectric element of this embodiment has the stack 10 formed by stacking a plurality of piezoelectric layers 1 and a plurality of internal electrodes 12 alternately, with the inactive layers 9 formed from piezoelectric material on either side of the stack 10 in the stacking direction. A pair of external electrodes 15 are provided on the opposing side faces of the stack 10 (one of the external electrodes is not shown). The internal electrodes 12 are not formed over the entire principal surface of the piezoelectric layer 1, and constitute the partial electrode structure. The internal electrodes 12 formed in the partial electrode structure are disposed so as to be exposed on either of the opposing side faces of the stack 10 in every other layer. Accordingly, the internal electrodes 12 are electrically connected to a pair of external electrodes 15 in every other layer. The pair of external electrodes 15 may also be formed on adjacent side faces. The external electrodes 15 are preferably formed from silver or an alloy consisting of silver as the main component, which has low electrical resistance and is easy to handle.

In the multi-layer piezoelectric element of this embodiment, as shown in FIG. 24, the peripheral portion 15a of the external electrode 15 has an isolated section 16 which gradually become thinner toward the periphery and is separated from the side face of the stack 10. In the multi-layer piezoelectric element having such a constitution, it is made possible to avoid the concentration of stress generated in the interface of bonding the external electrode and the stack by the differences in the thermal expansion and in the displacement between the external electrode 15 and the stack 10, and significantly decrease the possibility of cracks being generated in the stack 10 to which the external electrodes 15 are bonded, thereby improving the durability of the multi-layer piezoelectric element.

In order to form the peripheral portion 15a of the external electrode 15 so as to gradually become thinner toward the periphery, the viscosity of the paste to be screen-printed to form the external electrodes 15 may be controlled so that the peripheral portion 15a of the external electrode 15 spreads with a small thickness over the stack 10. Alternatively, the peripheral portion 15a of the external electrode 15 formed by printing with uniform thickness may be machined such as grinding to decrease the thickness gradually in the peripheral portion 15a.

In case the peripheral portion 15a of the external electrode 15 is formed in such a configuration as the thickness gradually become smaller toward the periphery, internal strain caused in the inclined external electrode 15 by shrinkage during firing or the difference in thermal expansion causes the peripheral portion 15a of the external electrode 15 spontaneously peel off the side faces of the stack 10, so as to form peripheral portion 15a of the external electrode 15. As another method for intentionally forming the isolated section 16 between the external electrode 15 and the side face of the stack 10, a releasing agent such as molybdenum which has low reactivity with the external electrodes 15 may be applied to the stack 10 where it is desired to form the isolated section. The isolated section 16 may also be formed by stacking a plurality of external electrodes 15 one on another so as to make use of the difference in the thermal expansion among these.

In case the peripheral portion 15a of the external electrode 15 has a uniform thickness or there is no isolated section 16 formed to separate from the side faces of the stack 10, it will lead to the following problem. When the external electrodes 15 are bonded onto the stack 10 by baking, stress caused by the difference in the thermal expansion among these members is concentrated in the junction, and a very high stress is generated in interface of bonding the external electrode 15 and the stack 10 by the difference in displacement between the external electrode 15 and the stack 10. As a result, cracks occur in the stack 10 at the interface with the external electrodes 15 bonded thereto, and may eventually grow so as to penetrate through the stack 10.

In the multi-layer piezoelectric element of the present invention, it is preferable to form voids between the isolated section 16 and the side faces of the stack 10. Presence of the voids significantly mitigates the stress generated in the interface of bonding the external electrode 15 and the stack 10. To form the voids between the isolated section 16 and the side faces of the stack 10, the peripheral portion 15a of the external electrode 15 may be formed in such a configuration as the thickness gradually become smaller toward the periphery, as described above. In case the peripheral portion 15a of the external electrode 15 is formed in such a configuration as the thickness gradually become smaller toward the periphery, internal strain caused in the inclined external electrode 15 by shrinkage during firing or the difference in thermal expansion causes the peripheral portion 15a of the external electrode 15 spontaneously peel off the side faces of the stack 10, so as to form peripheral portion of the external electrode. The voids can also be formed by stacking a plurality of external electrodes 15 or by making use of the difference in thermal expansion.

Figure 25:
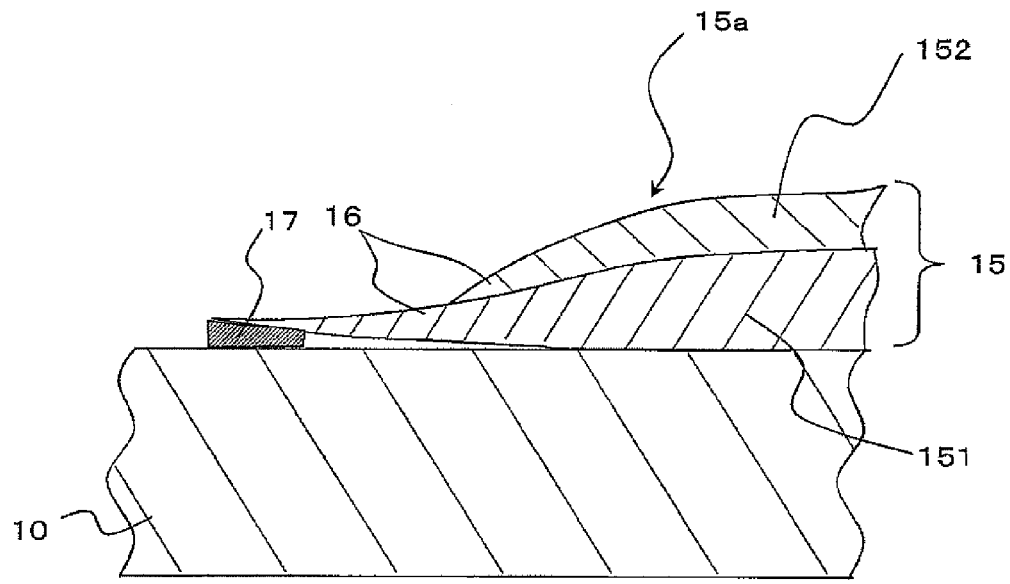
FIG. 25 is an enlarged sectional view of another example of junction between the piezoelectric layer and the external electrode in FIG. 23.

An insulating resin 17 may be provided in at least part of the area between the isolated section 16 and the side face of the stack, as shown in FIG. 25. Such a constitution enables it to maintain satisfactory insulation even when a high voltage is applied to the multi-layer piezoelectric element. The insulating resin 17 is preferably provided on the periphery between the isolated section 16 and the side face of the stack 10 (the periphery of the external electrode 15). Such a constitution enables it to maintain satisfactory insulation even when a high voltage of 200 V or more is applied to the multi-layer piezoelectric element. It is further preferable that the insulating resin 17 also fills the voids formed on the isolated section 16 and the side face of the stack 10. This makes it possible to maintain a very high, insulating performance, prevent discharge from occurring, prevent the insulation property from decreasing and maintain high reliability.

The insulating resin 17 is preferably formed from a silicone resin. The silicone resin can bond firmly with the stack 10 while, at the same time, shows high heat resistance, deterioration due to aging and has Young's modulus which is low enough to follow the displacement of the multi-layer piezoelectric element. Thus, the insulating resin 17 prevents discharge while maintaining high insulating property without making obstruction to the displacement of the stack 10, so that high reliability is ensured. While there are various types of silicone resin such as deacetic acid or deoxime type silicone resin depending on the variation of the curing reaction, alcohol-free type which does not generate a gas as the by-product of curing is preferably used. Also, because the silicone resin is often used under a high electric field of 200 V or higher, it is preferable to use the silicone resin having a high molecular weight without siloxane of a low molecular weight. The voids formed between the isolated section 16 and the side face of the stack 10 and particularly the isolated section 16 and the side face of the stack can be filled with silicone resin by carrying out deaeration and vacuum impregnation by using a vacuum pump.

The external electrodes 15 are preferably formed by stacking a plurality of electrode materials, which enables it to generate internal strain in the external electrode 15 so as to cause the peripheral portion 15a of the external electrode 15 to spontaneously peel off the side faces of the stack 10. While it becomes easier to cause the internal strain when the different layers of the electrode material have compositions slightly different from each other, the internal strain can be generated also by changing the baking temperature even when the layers have the same composition.

It is preferable to form the layer located outside, among the plurality of electrode materials, to have thermal expansion coefficient higher than that of the layer located inside. In such a constitution, stress is generated in the external electrode 15 located inside, while the peripheral portion 15a of the external electrode 15 gradually becomes thinner toward the periphery so that the isolated section 16 which is separated from the side face of the stack 10 is formed.

When the layer located inside has thermal expansion coefficient higher than that of the layer located outside, although internal stress is generate, compressive stress that suppresses the periphery 15a from peeling is generated and it becomes difficult to form the isolated section 16 which is separated from the side face of the stack 10.

It is preferable to form the innermost electrode layer so as to protrude beyond the other electrode layers toward the periphery. The internal stress generated in the external electrode 15 consisting of two or more layers has the highest intensity in the border of stacking. In case the innermost electrode layer is formed so as to protrude beyond the other electrode layers toward the periphery, the peripheral portion 15a of the protruding innermost electrode layer peels off, and the isolated section 16 which is separated from the side face of the stack 10 can be formed.

It is not preferable to form the electrode layer located outside so as to protrude beyond the other electrode layers toward the periphery. Because in this case, the electrode layer located outside is formed to conceal the other electrode layers, thus making the peripheral portion 15a less likely to peel off, and it become difficult to form the isolated section 16 not in contact with the side face of the stack 10.

It is particularly preferable to limit the isolated section 16 to the innermost electrode layer 151, which makes it possible to form the isolated section 16 not in contact with the side face of the stack 10 by making advantage of the peel-off of the protruding portion of the innermost electrode layer 151 toward the periphery.

It is also preferable to control the length of the isolated section 16 so that the length L of the projection of the isolated section onto the side face of the stack 10 is not less than 10 μm. The isolated section 16 having such a length enables it to avoid concentration of the stress generated in the interface of bonding the external electrode 15 and the stack 10, decreases the possibility of cracks being generated in the stack 10 to which the external electrodes 15 are bonded, thereby improving the durability of the multi-layer piezoelectric element. When the length L of the projection of the isolated section 16 onto the side face of the stack 10 is less than 10 μm, significant stress is concentrated in the interface of bonding the external electrode 15 and the stack 10, and cracks tend to be generated in the stack 10 to which the external electrodes 15 are bonded. It is not desirable that the length L of the projection of the isolated section 16 onto the side face of the stack 10 become as large as 500 μm or more, since it results in lower strength of the external electrode 15 which becomes more likely to peel off.

The angle θ which a straight line that connects the border between the part of the external electrodes 15 which is in contact with the side face of the stack 10 and the isolated section 16 and the distal end of the isolated section 16 forms with the side face of the stack is in a range from 1 to 45 degrees. With this configuration, the peripheral portion 15a of the external electrode 15 is formed in such a configuration as the thickness gradually become smaller toward the periphery, concentration of the stress generated in the interface of bonding the external electrode 15 and the stack 10 can be avoided, and internal strain is generated in the inclined external electrode 15 by shrinkage during firing or the difference in thermal expansion, so that such voids can be formed as the peripheral portion 15a of the external electrode 15 spontaneously peel off the side faces of the stack 10. When the angle θ is less than 1 degree, it may be difficult to form the peripheral portion 15a of the external electrode 15 with a thickness that gradually decreases toward the periphery. When the angle θ is more than 45 degrees, the interface of bonding the external electrode 15 and the stack 10 tend to be firmly bonded, thus resulting in concentration of high stress in the interface of bonding the external electrode 15 and the stack 10.

The distance H between the isolated section 16 and the side face of the stack 10 is preferably in a range from 1 μm to 50 μm. When the distance H is kept in this range, not only the stress generated in the interface of bonding the external electrode 15 and the stack 10 can be most effectively decreased, but also the space between the isolated section 16 and the side face of the stack 10 can be filled with the insulating resin 17, so as to maintain very high insulation. When the distance H is kept in the range described above, there is no possibility of discharge to occur and high reliability can be maintained. When the distance is less than 1 μm, it becomes difficult to fill the space sufficiently with the insulating resin 17. When the distance is greater than 50 μm, strength of the external electrode 15 becomes lower and is likely to peel off when applying the resin.

It is preferable that the external electrode 15 is formed by stacking a plurality of electrode materials 151, 152, . . . , with the electrode layer located outside has higher thermal expansion coefficient and the innermost electrode material 151 is formed to protrude beyond the other electrode materials 152, . . . , toward the periphery. This constitution makes it possible to satisfactorily form the isolated section 16 not in contact with the side face of the stack 10 and absorb the stress generated in the interface of bonding the external electrode 15 and the stack 10.

It is further preferable to limit the isolated section 16 to the innermost electrode layer 151, control the length of the isolated section 16 so that the length L of the projection of the isolated section 16 onto the side face of the stack 10 is not less than 10 μm, set the angle θ which a straight line that connects the border between the part of the external electrodes 15 which is in contact with the side face of the stack 10 and the isolated section 16 and the distal end of the isolated section 16 forms with the side face of the stack is in a range from 1 to 45 degrees, and control the distance H between the isolated section 16 and the side face of the stack 10 in a range from 1 μm to 50 μm, so as to most effectively decrease the stress generated in the interface of bonding the external electrode 15 and the stack 10.

A method of manufacturing the multi-layer piezoelectric element of the present invention will now be described. First, a calcined powder of a piezoelectric ceramic material constituted from perovskite type oxide consisting of $PbZrO_3$—$PbTiO_3$ or the like, a binder made of an organic polymer such as acrylic resin or butyral resin and a plasticizer such as DOP (dioctyl phthalate) or DBP (dibutyl phthalate) are mixed to form a slurry. The slurry is formed into ceramic green sheets that would become the piezoelectric layers 11 by a known method such as doctor blade process or calender roll process or other tape molding method.

Then a metal powder such as silver-palladium that would form the internal electrode 12, a binder and a plasticizer are mixed, to prepare an electrically conductive paste which is applied onto the top surfaces of the ceramic green sheets by screen printing method or the like to a thickness of 1 to 40 μm. The thickness of the internal electrode 12 and the voids in the internal electrode can be changed by changing the proportions of the binder, the plasticizer and the metal powder, changing the mesh size of the screen and changing the thickness of the resist that forms the screen pattern. Then a plurality of the green sheets having the electrically conductive paste printed thereon are stacked one on another, with the stack being heated to remove the binder. The stack is then fired at a temperature in a range from 900 to 1,200° C. thereby to make the stack 10. If the metal powder such as silver-palladium that constitutes the internal electrode 12 is added to the green sheet that forms the portion of the inactive layer 9, or if a slurry comprising the metal powder such as silver-palladium that constitutes the internal electrode 12, an inorganic compound, a binder and a plasticizer is printed on the green sheet when stacking the green sheets, shrinking behavior and shrinking rate can be matched between the inactive layer 9 and the other portions during sintering, and it is made possible to form the dense stack 10 with dense inner structure. The method of making the stack 10 is not limited to that described above, and any manufacturing method may be employed as long as the stack 10 can be made in such a constitution as a plurality of the piezoelectric layers 1 and a plurality of the internal electrodes 12 are stacked alternately one on another.

Then the external electrodes 15 are formed so as to achieve electrical continuity with the internal electrodes 12 of which ends are exposed on the side faces of the multi-layer piezoelectric element. The external electrodes 15 can be formed by printing and baking an electrically conductive silver-glass paste, which is prepared by adding a binder to a glass powder.

The peripheral portion 15a of the external electrode 15 must be printed so that the thickness thereof gradually decreases toward the periphery, which can be achieved by controlling the viscosity of the paste to be screen-printed to form the external electrodes 15 so that peripheral portion 15a of the external electrode 15 spreads with small thickness over the stack 10.

An example of the manufacturing process is as follows. To a mixture of a silver powder of flake-like particles having a mean particle size of 2 μm and an amorphous glass powder having a softening point of 640° C. including silicon having a mean particle size of 2 μm as the main component, about 8 parts by weight of binder is added for 100 parts by weight in total of the silver powder and the glass powder, so as to prepare the electrically conductive silver-glass paste by fully mixing the powders. A solvent is added to the paste so as to control the viscosity to around 200 d·Pa·s, and the paste is printed onto a predetermined position of the stack 10. The electrically conductive silver-glass paste is then fired at a temperature in a range from 500 to 800° C. for the purpose of effectively form a neck portion, cause silver included in the electrically conductive silver-glass paste and the internal electrode 12 to undergo diffusion bonding, and effectively maintain the voids to remain in the external electrodes 15. In case the peripheral portion 15a of the external electrode 15 is formed in such a configuration as the thickness gradually become smaller toward the periphery, internal strain caused in the inclined external electrode 15 by shrinkage during firing or the difference in thermal expansion causes the peripheral portion 15a of the external electrode 15 spontaneously peel off the side faces of the stack 10, so as to form the isolated section 16 between the external electrode 15 and the side face of the stack 10.

Then the stack 10 whereon the external electrodes 15 is dipped in a solution of silicone resin, and the silicone resin solution is deaerated in vacuum thereby filling the groove of the stack 10 with the silicone resin. The stack 10 is pulled up from the silicone resin solution, with the side faces of the stack 10 coated with the silicone resin. In this process, the voids formed in the isolated section 16 and the side face of the stack 10 can also be filled with the silicone resin. As the silicone resin is cured, the multi-layer piezoelectric element of the present invention is completed.

The multi-layer piezoelectric element of the present invention is not limited to those described above, and various modifications may be made within the scope of the present invention. While the embodiment described above dealt with a case where the external electrodes 15 are formed on the opposing side faces of the stack 10, a pair of the external electrodes 15 may also be formed on adjacent side faces, for example, according to the present invention.

According to the present invention, highest reliability of bonding of the external electrodes is achieved in such a form that both a part of the external electrode and a part of the cladding resin infiltrate from the side faces of the stack to between the piezoelectric layers, the peripheral portion of the external electrode is formed in such a configuration as the thickness gradually become smaller toward the periphery, and the isolated section not in contact with the side face of the stack is provided. This form combines the effects described above and achieves very high reliability of bonding of the external electrode through the synergy of these effects.

Injection Apparatus

Figure 26:
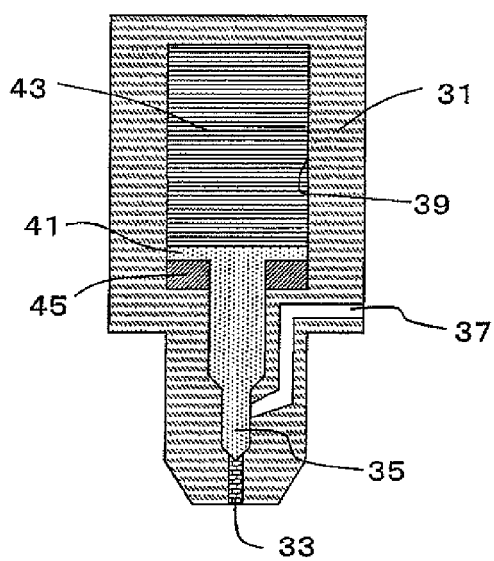
FIG. 26 is a sectional view of injection apparatus according to one embodiment of the invention.

FIG. 26 is a schematic sectional view of an injection apparatus according to one embodiment of the present invention. As shown in FIG. 26, the injection apparatus of this embodiment has a container 31 having an injection hole 33 formed at one end thereof, with the multi-layer piezoelectric element of the present invention housed in the container. A needle valve 35 that can open and close the injection hole 33 is housed in the container 31. The injection hole 33 is provided with a fuel passage 37 disposed so as to be capable of making communication therewith according to the action of the needle valve 35. The fuel passage 37 is connected to a fuel source that is provided outside of the apparatus, so as to receive supply of fuel at a high pressure that remains always constant. When the needle valve 35 opens the injection hole 35, the fuel that fills the fuel passage 37 is injected at a predetermined level of high pressure into a fuel chamber of an internal combustion engine that is not shown in the drawings.

The needle valve 35 has an enlarged top portion of a larger inner diameter so as to serve as a piston 41 that makes sliding motion in a cylinder 39 which is formed in the container 31. The piezoelectric actuator 43 comprising the multi-layer piezoelectric element described above is housed in the container 31.

With the injection apparatus as described above, when the piezoelectric actuator 43 is caused to expand by a voltage applied thereto, the piston 41 is pressed so that the needle valve 35 plugs the injection hole 33 and shuts off the fuel supply. When the voltage is removed, the piezoelectric actuator 43 contracts and a Belleville spring 45 presses back the piston 41 so that the injection hole 33 communicates with the fuel passage 37 thereby allowing the fuel to be injected.

The injection apparatus of the present invention may have such a constitution that has a container having an injection hole and the multi-layer piezoelectric element, wherein the fuel that fills the container is discharged from the injection hole by the operation of the multi-layer piezoelectric element. In the present invention, the word liquid refers to various liquid fluids (such as electrically conductive paste) in addition to fuel and ink.

The present invention relates to the multi-layer piezoelectric element and the injection apparatus. However, the present invention is not limited to the embodiments described above. For example, the present invention can be applied to a fuel injection apparatus of automobile engine, liquid ejecting apparatus of ink jet printer or the like or a drive unit (piezoelectric actuator) used in precision positioning device or vibration preventing device for an optical apparatus, or to sensor devices such as a sensor element mounted in combustion pressure sensor, knocking sensor, acceleration sensor, load sensor, ultrasound sensor, pressure sensor, yaw rate sensor or the like, or used as a circuit component mounted in piezoelectric gyro, piezoelectric switch, piezoelectric transducer, piezoelectric breaker or the like, and is also applicable to other purposes, as long as the piezoelectric characteristic is utilized.

Fuel Injection System

Figure 27:
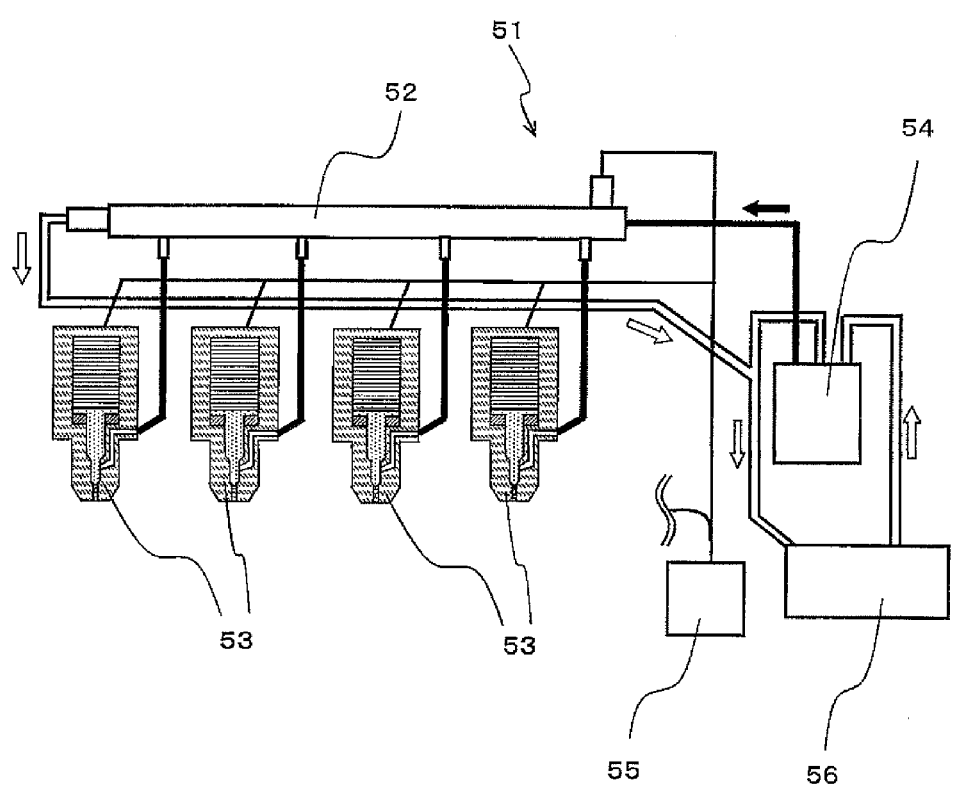
FIG. 27 is a schematic diagram showing a fuel injection system according to one embodiment of the invention.
Figure 28:
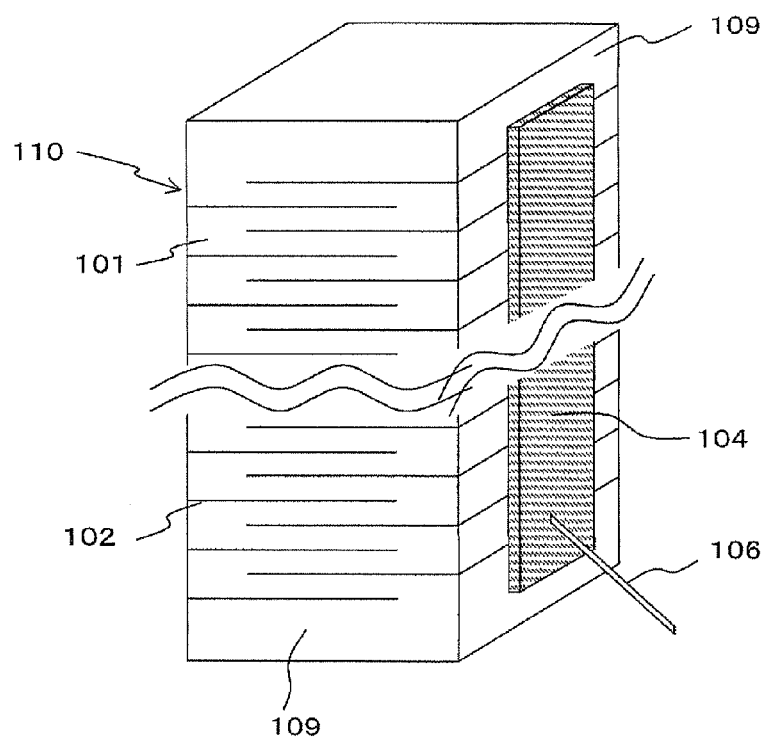
FIG. 28 is a perspective view of the multi-layer piezoelectric element of the prior art.
Figure 29:
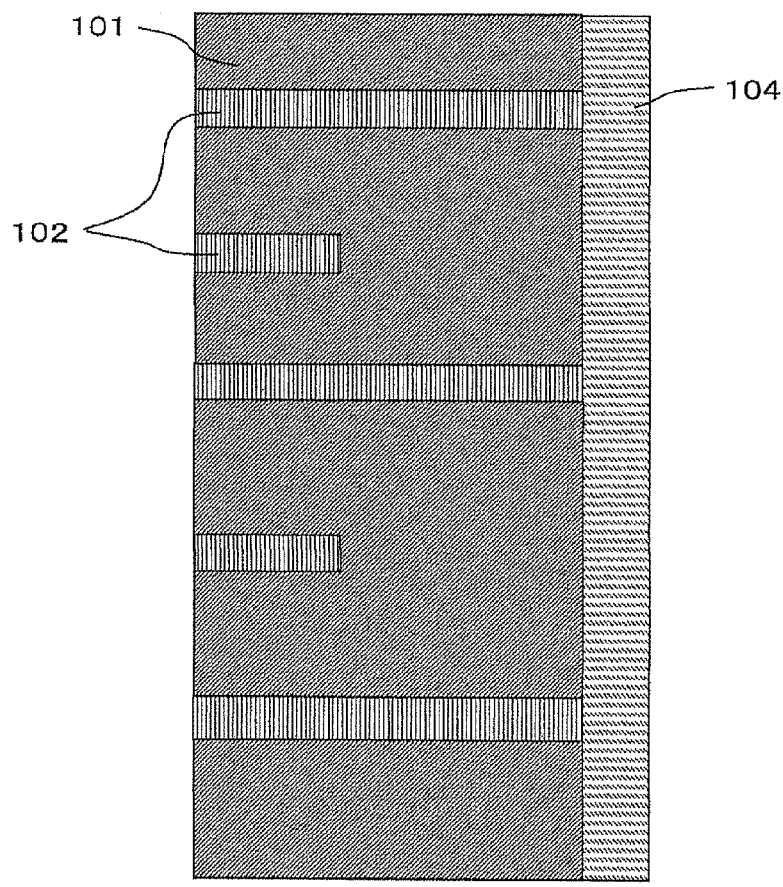
FIG. 29 is an enlarged sectional view of a junction between the side face of the stack and the external electrode in the multi-layer piezoelectric element of the prior art.

FIG. 27 schematically shows a fuel injection system according to one embodiment of the present invention. As shown in FIG. 27, the fuel injection system 51 according this embodiment comprises a common rail 52 that contains a fuel stored at a high pressure, a plurality of injection device 53 which inject the fuel stored in the common rail 52, a pump 54 which supplies the fuel to the common rail 52 at a high pressure and an injection control unit 55 that supplies a drive signal to the injection apparatus 53.

The injection control unit 55 controls the quantity of fuel injected and the timing of injection, while monitoring the condition in the engine. The pump 54 supplies the fuel from the fuel tank 56 to the common rail 52 by boosting the pressure to about 1,000 to 2,000 atm, preferably from 1,500 to 1,700 atm. The common rail 54 stores the sent by the pump 54 and sends it to the injection apparatus 53 as required. The injection apparatus 53 injects a small amount of fuel by spraying through the injection hole 33.

Example 1

A multi-layer piezoelectric actuator comprising the multi-layer piezoelectric element of the present invention was fabricated as described below. First, a calcined powder of a piezoelectric ceramic material constituted from lead titanate zirconate PZT having a mean particle size of 0.4 µm as the main component, a binder and a plasticizer were mixed to form a slurry which was formed into ceramic green sheets that would become the piezoelectric layer 1 having thickness of 150 µm by the doctor blade process.

An electrically conductive paste, prepared by adding a binder to a silver-palladium alloy, was applied to one side of the ceramic green sheet by screen printing method. Then 300 pieces of the ceramic green sheets were stacked and fired at a temperature from 980 to 1100° C. to obtain a fired stack. Then, the fired stack was ground into a predetermined shape by using a known planar grinding machine or the like to obtain the stack 10.

To a mixture of a silver powder having a mean particle size of 2 µm and a glass powder having a softening point of 650° C. including silicon having a mean particle size of 2 µm as the main component, a binder was added so as to prepare the electrically conductive silver-glass paste, which was printed onto the side face of the stack 10 where the external electrode 4 was to be formed to a thickness of 30 µm by screen printing. The electrically conductive silver-glass paste was then fired at 700° C. for 30 minutes.

In sample No. 1, a part of the external electrode 4 was caused to infiltrate between the piezoelectric layers 1 so as to form the infiltrating portion 4a, while the infiltrating portion was not formed in sample No. 2. In sample No. 1, the metal layer 2a, located between the piezoelectric layers 1 where the infiltrating portion 4a was formed, was formed as follows. 200% by volume of acrylic beads having a mean particle size of 0.5 µm was added to 100% by volume of silver-palladium alloy, to which a binder was added further, so as to prepare an electrically conductive paste. This electrically conductive paste was printed onto one side of the ceramic green sheets to a thickness of 4 µm. The metal layer 2b located between the piezoelectric layers 1, where the infiltrating portion was not to be formed, was made by printing the electrically conductive paste prepared by adding a binder to the silver-palladium alloy without acrylic beads added thereto to a thickness of 4 µm. In sample No. 1, the sheets were stacked one on another in a proportion of 20 sheets whereon the electrically conductive paste (without acrylic beads added) prepared for forming the other metal layers 2b was printed, for one sheet whereon the electrically conductive paste (with acrylic beads added) prepared for forming the metal layers 2a was printed. A part of the external electrode 4 infiltrated to a mean depth of 20 µm so as to form the infiltrating portion 4a in the region between the end of the metal layer 2a formed from the electrically conductive paste and the side faces of the stack 10. A mean void ratio A in the metal layer 2a was 80%, and a mean void ratio B in the other metal layer 2b was 20%. The metal layer 2a was constituted from metal composition (partial metal layers) dispersed in islands-like distribution.

Then lead wires were connected to the external electrodes 4, and DC electric field of 3 kV/mm was applied between the external electrodes 4 of positive and negative polarities via the lead wires so as to apply polarization treatment for 15 minutes, thereby to complete the multi-layer piezoelectric actuator based on the multi-layer piezoelectric element as shown in FIG. 1. When a DC voltage of 160 V was applied to the multi-layer piezoelectric actuator thus obtained, it underwent displacement of 40 µm in the stacking direction. Then an AC voltage of 150 Hz from 0 to +160 V was applied to the multi-layer piezoelectric actuator at the room temperature, to carry out continuous operation test of $1 \times 10^9$ cycles. Results of the test are shown in Table 1.

TABLE 1

| Sample No. | Connection of external electrodes | Depth D | Initial displacement | Displacement after $1 \times 10^9$ cycles of operation |
|---|---|---|---|---|
| 1 | Infiltrating portion provided | 20 µm | 40 µm | 40 µm |
| 2 | No infiltrating portion provided | — | 40 µm | 30 µm |

As shown in Table 1, the multi-layer piezoelectric actuator of the present invention (sample No. 1) achieved a displacement of 40 µm, which was comparable to that recoded prior to continuous operation, and no abnormality was found in the external electrodes 4. In the case of sample No. 2, that was out of the scope of the invention where no part of the external electrode infiltrated into the metal layer, initial displacement was the same as that of sample No. 1, although the displacement decreased to 30 µm after $1 \times 10^9$ cycles of operation. This is because sample No. 2 did not have the infiltrating portion formed therein (no part of the external electrode infiltrated into the metal layer), and therefore bonding strength between the external electrode and the side face of the stack was weak and a part of the external electrode peeled off the side face of the stack, resulting in wire breakage between a part of the internal electrode and the external electrode. As a result, some of the piezoelectric layers were not supplied with power, thus decreasing the amount of displacement.

Example 2

The multi-layer piezoelectric element was fabricated similarly to Example 1, except for changing the infiltrating depth D of the infiltrating portion 4a, a void ratio A in the metal layer 2a located between the piezoelectric layers where the infiltrating portion 4a was formed, void ratio B in the other metal layer 2b, structure of the metal layer 2a, arrangement of the metal layer 2a and the content of Ag that constitutes the metal layer as shown in Table 1. In order to standardize the amount of initial displacement at 40 µm for all samples, displacement characteristic was adjusted by increasing the number of metal layers 2b that were stacked in electrical continuity by taking the number of metal layers 2a into account, for the samples where the metal layer 2a did not function as the electrode (not in electrical continuity). Results of evaluation are shown in Table 2.

TABLE 2

| Sample No. | Presence of infiltrating portion | Infiltrating depth D of infiltrating portion | Void ratio A (%) in metal layer 2a | Structure of metal layer 2a | Void ratio B (%) in metal layer 2b |
|---|---|---|---|---|---|
| 1 | Present | 20 μm | 80 | Porous metal layer 1*1 | 20 |
| 3 | Present | 5 μm | 40 | Porous metal layer 2*2 | 40 |
| 4 | Present | 5 μm | 40 | Porous metal layer 2*2 | 20 |
| 5 | Present | 20 μm | 80 | Porous metal layer 1*1 | 20 |
| 6 | Present | 20 μm | 80 | Porous metal layer 1*1 | 20 |
| 7 | Present | 1 μm | 80 | Porous metal layer 1*1 | 20 |

| Sample No. | Arrangement of metal layer 2a | Proportion R1 of group 11 metal of periodic table*5 | Initial displacement | Displacement after $1 \times 10^9$ cycles of operation |
|---|---|---|---|---|
| 1 | Orderly*3 | 1.2 | 40 μm | 40 μm |
| 3 | Irregular*4 | 1 | 40 μm | 40 μm |
| 4 | Irregular*4 | 1 | 40 μm | 40 μm |
| 5 | Irregular*4 | 1 | 40 μm | 40 μm |
| 6 | Orderly*3 | 1 | 40 μm | 40 μm |
| 7 | Orderly*3 | 1 | 40 μm | 40 μm |

*1Porous metal layer 1: porous metal layer constituted from a plurality of partial metal layers which are dispersed to be isolated from each other, and does not function as an electrode.
*2Porous metal layer 2: porous metal layer of which voids are mostly independent pores and functions as an electrode.
*3For one metal layer 2a, 20 of other metal layers are stacked.
*4Block consisting of one metal layer 2a and 20 of other metal layers and block consisting of one metal layer 2a and 10 of other metal layers are stacked alternately.
*5Proportion R1 = (Content of Ag in metal layer 2a)/(Content of Ag in metal layer 2b)

The results shown in Table 2 indicate that samples Nos. 1, 3, 4, 5, 6 and 7 which are the multi-layer piezoelectric actuator of the present invention achieved displacement comparable to that of prior to the continuous operation, after the continuous operation of $1 \times 10^9$ cycles, and showed high reliability.

Example 3

The multi-layer piezoelectric element was fabricated similarly to Example 1, except for changing the void ratio E in the metal layer 2e located on both sides of the metal layer 2a in the stacking direction, the thickness of the metal layer 2e and the other metal layers, polarity (positive or negative) of the metal layer 2e located on both sides of the metal layer 2a in the stacking direction, etc. In order to standardize the amount of initial displacement at 40 μm for all samples, difference in the displacement characteristic due to the polarity difference of the metal layer 2e was adjusted by changing the number of metal layers 2b. Continuous operation test was conducted similarly to Example 1, except for raising the operating voltage by 40 V to 0 to +200 V so as to accelerate the change. Results of the test are shown in Table 3.

The results shown in Table 3 indicate that samples Nos. 1, 8 and 9 which are the multi-layer piezoelectric actuator of the present invention showed an effect of improving the displacement after the continuous operation and had high reliability.

Example 4

The multi-layer piezoelectric element was fabricated similarly to Example 1, except for forming the external electrode 4 constituted from four layers of 4b, 4c, 4d and 4e on the side face of the stack as shown in FIG. 11 and changing the content of glass material in the external electrode. In order to standardize the amount of initial displacement at 40 μm for all samples, difference in the displacement characteristic was adjusted by changing the number of metal layers 2b which were in electrical continuity, by taking the number of metal layers 2a into account, for the samples where the metal layer 2a did not function as the electrode (not in electrical continuity). Continuous operation test was conducted similarly to Example 1, except for raising the operating voltage by 40 V to 0 to +200 V to accelerate the change. Results of the test are shown in Table 4.

TABLE 3

| Sample No. | Presence of infiltrating portion | Infiltrating depth D of infiltrating portion | Void ratio A (%) in metal layer 2a | Void ratio A (%) in metal layer 2b | Void ratio E (%) in metal layer 2e located on both sides of metal layer 2a in the stacking direction | (Thickness of metal layer 2e)/(Thickness of other metal layer) (%) |
|---|---|---|---|---|---|---|
| 1 | Present | 20 μm | 80 | 20 | 20 | 100 |
| 8 | Present | 20 μm | 80 | 20 | 19 | 105 |
| 9 | Present | 20 μm | 80 | 20 | 18 | 110 |

| Sample No. | Structure of metal layer 2a | Arrangement of metal layer 2a | Proportion R1 of group 11 metal of periodic table*3 | Polarity of metal layer located on both sides of metal layer 2a in the stacking direction | Initial displacement | Displacement after $1 \times 10^9$ cycles of operation |
|---|---|---|---|---|---|---|
| 1 | Porous metal layer 1*1 | Orderly*2 | 1.2 | Different Polarity | 40 μm | 25 μm |
| 8 | Porous metal layer 1*1 | Orderly*2 | 1.2 | Same Polarity | 40 μm | 30 μm |
| 9 | Porous metal layer 1*1 | Orderly*2 | 1.2 | Same Polarity | 40 μm | 32 μm |

*1Porous metal layer 1: porous metal layer constituted from a plurality of partial metal layers which are dispersed to be isolated from each other, and does not function as an electrode.
*2For one metal layer 2a, 20 of other metal layers are stacked.
*3Proportion R1 = (Content of Ag in metal layer 2a)/(Content of Ag in metal layer 2b)

TABLE 4

| Sample No. | Components of external electrode | Presence of infiltrating portion | Content of glass material in external electrode | Content of glass material in plurality of layers constituting the external electrode[*6] | Void ratio A (%) in metal layer 2a | Structure of metal layer 2a |
|---|---|---|---|---|---|---|
| 3 | Electrically conductive material + glass | Present | Infiltrating portion ≧ External electrode body | S side < Outside | — | Porous metal layer 2[*2] |
| 4 | Electrically conductive material + glass | Present | Infiltrating portion ≧ External electrode body | S side ≧ Outside | 40 | Porous metal layer 2[*2] |
| 5 | Electrically conductive material + glass | Present | Infiltrating portion ≧ External electrode body | S side ≧ Outside | 80 | Porous metal layer 1[*1] |
| 6 | Electrically conductive material + glass | Present | Infiltrating portion ≧ External electrode body | S side ≧ Outside | 80 | Porous metal layer 1[*1] |
| 7 | Electrically conductive material + glass | Present | Infiltrating portion ≧ External electrode body | S side ≧ Outside | 80 | Porous metal layer 1[*1] |
| 8 | Electrically conductive material + glass | Present | Infiltrating portion ≧ External electrode body | S side ≧ Outside | 80 | Porous metal layer 1[*1] |
| 9 | Electrically conductive material + glass | Present | Infiltrating portion ≧ External electrode body | S side ≧ Outside | 80 | Porous metal layer 1[*1] |

| Sample No. | Infiltrating portion covers the surface of partial electrode layer | Arrangement of metal layer 2a | Proportion R2 of group 11 metal of periodic table[*5] | Relation between thickness T of external electrode and depth D | Initial displacement | Displacement after $1 \times 10^4$ cycles of operation |
|---|---|---|---|---|---|---|
| 3 | — | Irregular[*4] | — | — | 40 μm | 25 μm |
| 4 | — | Irregular[*4] | — | — | 40 μm | 27 μm |
| 5 | — | Irregular[*4] | — | — | 40 μm | 30 μm |
| 6 | ○ | Irregular[*4] | — | — | 40 μm | 34 μm |
| 7 | ○ | Irregular[*4] | — | — | 40 μm | 36 μm |
| 8 | ○ | Orderly[*3] | 0.8 | — | 40 μm | 37 μm |
| 9 | ○ | Orderly[*3] | 1 | D = 0.2T | 40 μm | 38 μm |

[*1]Porous metal layer 1: porous metal layer constituted from a plurality of partial metal layers which are dispersed to be isolated from each other, and does not function as an electrode.
[*2]Porous metal layer 2: porous metal layer of which voids are mostly independent pores and functions as an electrode.
[*3]For one metal layer 2a, 20 of other metal layers are stacked.
[*4]Block consisting of one metal layer 2a and 20 of other metal layers and block consisting of one metal layer 2a and 10 of other metal layers are stacked alternately.
[*5]Proportion R2 = (Content of Ag in metal layer 2a)/(Content of Ag in metal layers located on both sides of metal layer 2a in the stacking direction)
[*6]S side refers to one of plurality of layers, that constitute the external layer, which is located on the side face side of the stack.
Outside refers to one of plurality of layers, that constitute the external layer, which is located at the outermost position.

The results shown in Table 4 indicate that samples Nos. 3 through 10 which are the multi-layer piezoelectric actuator of the present invention showed an effect of improving the displacement after the operation and had high reliability.

Example 5

First, a calcined powder of a piezoelectric ceramic material constituted from lead titanate zirconate ($PbZrO_3$—$PbTiO_3$) having a mean particle size of 0.4 μm as the main component, a binder and a plasticizer were mixed to form a slurry which was formed into ceramic green sheets that would become the piezoelectric layer 1 having thickness of 150 μm by the doctor blade process.

An electrically conductive paste, prepared by adding a binder to a silver-palladium alloy, was applied to one side of the ceramic green sheet by screen printing method. Then 300 pieces of the sheets having the electrically conductive paste printed thereon were stacked and fired at a temperature from 980 to 1100° C. to obtain a fired stack.

The porous metal layer 2a' where infiltration of the cladding resin 21 was intended was formed by printing, with a thickness of 4 μm, an electrically conductive paste prepared by adding 200% by volume of acrylic beads having a mean particle size of 0.5 μm to 100% by volume of a silver-palladium alloy, and adding a binder to the mixture. The other metal layer 2b where infiltration of the cladding resin 21 was not intended was formed by printing, with a thickness of 4 μm, an electrically conductive paste prepared by adding a binder to silver-palladium alloy that did not include acrylic beads.

The proportion of the metal layer 2b without infiltration of the cladding resin 21 and the porous metal layer 2a' having the cladding resin 21 infiltrated therein was set to 20:1. The green sheets were stacked in such an orderly manner as 20 green sheets having the electrically conductive paste for the metal layer 2b printed thereon were stacked and one green sheet having the electrically conductive paste for the porous metal layer 2a' printed thereon was placed on the stack.

The fired stack was ground with a planar grinding machine, thereby to obtain the stack 10.

To a mixture of a silver powder having a mean particle size of 2 μm and a glass powder having a softening point of 650° C. including silicon having a mean particle size of 2 μm as the main component, a binder was added so as to prepare the electrically conductive silver-glass paste. The electrically conductive silver-glass paste was printed onto the side face of the stack 10, where the external electrode 4 was to be formed, to a thickness of 30 μm by screen printing, and was fired at 700° C. for 30 minutes, thereby forming the external electrodes 4.

After connecting lead wires to the external electrodes 4, the device was coated with silicone resin by dipping and deaeration in vacuum, thereby forming the cladding resin 21.

A part of the cladding resin 21 (interior resin 21a) was found infiltrating to mean depth of 10 μm into the region between the end of the porous metal layer 2a', which was formed from the electrically conductive paste including the acrylic beads, and the side face of the stack 10. Mean void ratio in the porous metal layer 2a' was 80%, and mean void ratio in the other metal layer 2b was 10%. The porous metal layer 2a' was constituted from partial metal layers formed from metal composition (partial metal layers) dispersed in islands-like distribution.

Then DC electric field of 3 kV/mm was applied between the external electrodes 4 of positive and negative polarities via the lead wires so as to apply polarization treatment for 15 minutes, thereby to complete the multi-layer piezoelectric actuator based on the multi-layer piezoelectric element as shown in FIG. 13 (sample No. 10).

In the meantime, multi-layer piezoelectric actuator was fabricated similarly to the above, except for making the stack by stacking only the green sheets having the electrically conductive paste prepared for the metal layer 2b printed thereon without using the green sheets having the electrically conductive paste prepared for the metal layer 2a printed thereon (sample No. 11). In this actuator, the cladding resin did not infiltrate into the region between the piezoelectric layers.

When a DC voltage of 160 V was applied to the multi-layer piezoelectric actuator obtained as described above, it showed insulation resistance of 30 MΩ. Then an AC voltage of 100 Hz from 0 to +160 V was applied to the multi-layer piezoelectric actuator at temperature of 85° C. and humidity of 85% RH, to carry out continuous operation test of $1 \times 10^9$ cycles. Results of the test are shown in Table 5.

TABLE 5

| Sample No. | State of cladding resin | Initial insulation resistance | Insulation resistance after $1 \times 10^9$ cycles of operation |
|---|---|---|---|
| 10 | Part of cladding resin infiltrates between piezoelectric layers | 30 MΩ | 30 MΩ |
| 11 | No part of cladding resin infiltrates between piezoelectric layers | 30 MΩ | 1 MΩ or less |

As shown in Table 5, the multi-layer piezoelectric actuator of the present invention (sample No. 10) showed the same insulation resistance of 30 MΩ as that before the continuous operation, and no abnormality was found in the cladding resin. In the case of the multi-layer piezoelectric actuator of sample No. 11, that was out of the scope of the invention where no part of the cladding resin infiltrated into the metal layer, initial displacement was the same as that of the multi-layer piezoelectric actuator of the present invention, although burn stain was observed in part of the silicone resin and the insulation resistance decreased to 1 MΩ after $1 \times 10^9$ cycles of operation. This is supposedly because the multi-layer piezoelectric actuator of sample No. 11 did not have a part (interior resin) of the cladding resin infiltrating into the metal layer, and therefore bonding strength between the cladding resin and the side face of the stack was weak, and therefore a part of the external electrode peeled off the side face of the stack, thus allowing moisture in the atmosphere to enter the peeling portion, with the moisture decreasing the insulation resistance.

Example 6

A multi-layer piezoelectric actuator was fabricated similarly to Example 5, except for changing the state of the metal layer 2a wherein a part (interior resin) of the cladding resin 21 infiltrated. In the multi-layer piezoelectric actuator where the metal layer 2a into which a part (interior resin) of the cladding resin 21 infiltrated was not in electrical continuity, number of the meta layers 2b, which had no part of the cladding resin 21 infiltrated and were in electrical continuity, was increased by taking the number of metal layers 2a without electrical continuity into account. Results of evaluation are shown in Table 6.

"Void ratio A" in Table 6 refers to the void ratio in the metal layer into which a part of the cladding resin infiltrated. "Void ratio B" in Table 6 refers to the void ratio in the metal layer located on both sides of the metal layer, into which a part of the cladding resin infiltrated, adjacent thereto in the stacking direction. The phrase "state of metal layer" in Table 6 relates to whether the metal layer into which a part of the cladding resin infiltrated is constituted from a plurality of dispersed partial metal layers or not, and "o" means that the sample has the partial metal layers and "-" means that the sample does not have the partial metal layers. The phrase "Arrangement of metal layer" in Table 6 relates to whether the metal layers into which a part of the cladding resin infiltrated are disposed in an orderly arrangement in the stacking direction, and "-" means that the metal layers are randomly disposed. "Proportion of group 11 metal" in Table 6 refers to the proportion of the metal of group 11 of the Periodic Table that constitutes the metal layer into which a part of the cladding resin infiltrated and the proportion of the metal of group 11 of the Periodic Table that constitutes the metal layers located on both sides of this metal layer (metal layer having part of cladding resin infiltrated therein/metal layers on both sides thereof).

TABLE 6

| Sample No. | A part of the cladding resin infiltrates between piezoelectric layers | Void ratio A (%) in metal layer | Void ratio B (%) in metal layer | State of metal layer | Arrangement of metal layer | Proportion of group 11 metal | Initial insulation resistance | Insulation resistance after $1 \times 10^9$ cycles of operation |
|---|---|---|---|---|---|---|---|---|
| 10 | ○ | 80 | 20 | ○ | One provided for every 20 layers | 1.2 | 30 MΩ | 30 MΩ |
| 12 | ○ | 40 | 40 | — | — | 1 | 30 MΩ | 30 MΩ |
| 13 | ○ | 40 | 20 | — | — | 1 | 30 MΩ | 30 MΩ |
| 14 | ○ | 80 | 20 | ○ | — | 1 | 30 MΩ | 30 MΩ |
| 15 | ○ | 80 | 20 | ○ | — | 1 | 30 MΩ | 30 MΩ |
| 16 | ○ | 80 | 20 | ○ | One provided for every 20 layers | 1 | 30 MΩ | 30 MΩ |

The results shown in Table 6 indicate that samples Nos. 10, 12, 13, 14, 15 and 16 which are the multi-layer piezoelectric actuator of the present invention show insulation resistance comparable to that prior to the continuous operation, after the continuous operation of $1 \times 10^9$ cycles and have high reliability.

Example 7

First, a calcined powder of a piezoelectric ceramic material constituted from lead titanate zirconate ($PbZrO_3$—$PbTiO_3$) having a mean particle size of 0.4 μm as the main component, a binder and a plasticizer were mixed to form a slurry which was formed into ceramic green sheets that would become the piezoelectric material 1 having thickness of 150 μm by the doctor blade process.

An electrically conductive paste, prepared by adding a binder to the silver-palladium alloy (95% by weight of silver, 5% by weight of palladium), was applied to one side of the ceramic green sheet by the screen printing method. Then 300 pieces of the sheets were stacked and fired at 1,000° C. After holding at 800° C., and the fired stack was polished to dimensions of 8 mm by 100 mm.

To a mixture of silver powder of flake-like particles having a mean particle size of 2 μm and amorphous glass powder having softening point of 640° C. including silicon having a mean particle size of 2 μm as the main component, a binder was added, so as to prepare the electrically conductive silver-glass paste while changing the proportions of the silver powder and the glass powder and the viscosity. The electrically conductive silver-glass paste was screen-printed and baked. Then electrically conductive silver-glass paste was prepared again and screen-printed onto an inner layer of electrode which had been formed while changing the position slightly, so as to form the outer layer of electrode by baking. This process was repeated to form the external electrode 15 consisting of a plurality of electrically conductive materials.

Then lead wires were connected to the external electrodes 15, and DC electric field of 3 kV/mm was applied between the external electrodes 15 of positive and negative polarities through the lead wires so as to apply polarization treatment for 15 minutes, thereby to complete the multi-layer piezoelectric actuator based on the multi-layer piezoelectric element.

When a DC voltage of 170 V was applied to the multi-layer piezoelectric device thus obtained, all the multi-layer piezoelectric actuators underwent displacement in the stacking direction.

Then an AC voltage of 150 Hz from 0 to +170 V was applied to the multi-layer piezoelectric actuator at the room temperature, to carry out continuous operation test of $1 \times 10^9$ cycles.

Results of the test are shown in Table 7. The length L in Table 7 means the length of projection of the isolated section onto the side face of the stack. The angle θ means the angle which a straight line that connects the border between the part of the external electrodes which is in contact with the side face of the stack and the isolated section and the distal end of the isolated section forms with the side face of the stack. The distance H means the distance between the distal end of the isolated section and the side face of the stack.

TABLE 7

| Sample No. | State of peripheral portion of the external electrode | Presence of isolated section | Presence of voids | State of insulating resin | Type of resin | Number of layers of external electrode | Difference in thermal expansion among plurality of external electrodes |
|---|---|---|---|---|---|---|---|
| 17 | Gradual thinning | Present | None | Interposed between isolated section and side face of stack | Polyimide resin | 1 | Not applicable |
| 18 | Gradual thinning | Present | Present | Interposed between isolated section and side face of stack | Silicone resin | 1 | Not applicable |
| 19 | Gradual thinning | Present | Present | Interposed between isolated section and side face of stack | Silicone resin | 2 | Outer layer is larger than inner layer |
| 20 | Gradual thinning | Present | Present | Interposed in peripheral portion between isolated section and side face of stack | Silicone resin | 2 | Outer layer is larger than inner layer |
| 21 | Gradual thinning | Present | Present | Fills in between isolated section and side face of stack | Silicone resin | 2 | Outer layer is larger than inner layer |
| 22 | Gradual thinning | Present | Present | Fills in between isolated section and side face of stack | Silicone resin | 3 | Outer layer is larger than inner layer |
| 23 | Constant thickness | None | None | None | None | 1 | Not applicable |

| Sample No. | State of peripheral portion of plurality of external electrodes | Electrode material in isolated section | Length L | Angle θ | Distance H | Displacement (μm) | Change in displacement after $1 \times 10^9$ cycles of continuous operation | Electrical insulation |
|---|---|---|---|---|---|---|---|---|
| 17 | Not applicable | Not applicable | 5 μm | 45° C. | 0 | 50 | No change | Good (>1 × 10$^{12}$ Ωcm) |
| 18 | Not applicable | Not applicable | 10 μm | 30° C. | 1 μm | 58 | No change | Good (>1 × 10$^{12}$ Ωcm) |
| 19 | Not applicable | Not applicable | 10 μm | 25° C. | 10 μm | 62 | No change | Good (>1 × 10$^{12}$ Ωcm) |

TABLE 7-continued

| | | | | | | | | |
|---|---|---|---|---|---|---|---|---|
| 20 | Innermost layer protrudes beyond other layers toward periphery | Electrode material of the innermost layer only | 20 μm | 20° C. | 15 μm | 62 | No change | Good (>1 × $10^{12}$ Ωcm) |
| 21 | Innermost layer protrudes beyond other layers toward periphery | Electrode material of the innermost layer only | 30 μm | 10° C. | 40 μm | 66 | No change | Good (>1 × $10^{12}$ Ωcm) |
| 22 | Innermost layer protrudes beyond other layers toward periphery | Electrode material of the innermost layer only | 35 μm | 1° C. | 50 μm | 68 | No change | Good (>1 × $10^{12}$ Ωcm) |
| 23 | Not applicable | Not applicable | Not applicable | 90° C. | Not applicable | 60 | Piezoelectric element was destroyed | Unsatisfactory (<1 × $10^{10}$ Ωcm) |

From table 7, it can be seen that significant stress was generated in the interface of bonding the external electrode 15 and the stack 10, in case thickness of the peripheral portion 15a of the external electrode 15 was constant or the isolated section 16 was not formed as in the case of sample No. 23 that is Comparative Example. The stress resulted in the occurrence of crack in the border between the stack 10 and the external electrode 15 bonded thereto, the crack growing to such an extent that penetrated the stack 10 and decreasing the insulation resistance to less than 1×$10^{10}$ Ωcm.

Samples Nos. 17 through 22 which are the multi-layer piezoelectric actuator of the present invention maintained the effective displacement required for the piezoelectric actuator without change in the amount of displacement after the continuous operation of 1×$10^9$ cycles, while maintaining satisfactory insulation of 1×$10^{12}$ Ωcm or higher and high reliability.

Samples Nos. 19 through 22, in particular, showed large displacement of 60 μm or more after the continuous operation of 1×$10^9$ cycles, thus providing multi-layer piezoelectric actuator of high reliability.

The invention claimed is:

1. A multi-layer piezoelectric element comprising:
a stack having a plurality of piezoelectric layers and a plurality of metal layers, the piezoelectric layers and metal layers being stacked alternately one on another; and
a covering member that covers at least a part of the side faces of the stack,
wherein at least one of the metal layers is a porous metal layer which includes more voids than the metal layers that adjoin therewith on both sides thereof in the stacking direction, and a part of the covering member infiltrates between two piezoelectric layers which adjoin the porous metal layer in the stacking direction.

2. The multi-layer piezoelectric element according to claim 1,
wherein the covering member is a cladding resin that covers the side face of the stack.

3. The multi-layer piezoelectric element according to claim 1,
wherein the covering member is a pair of external electrodes connected alternately to the plurality of metal layers.

4. The multi-layer piezoelectric element according to claim 1,
wherein the covering member is a cladding resin that covers the side faces of the stack and a pair of external electrodes connected alternately to the plurality of metal layers.

5. The multi-layer piezoelectric element according to claim 3,
wherein the external electrodes include an electrically conductive material and a glass material, and a part of the external electrodes that infiltrates between the two piezoelectric layers includes a higher content of the glass content than the rest of the external electrodes.

6. The multi-layer piezoelectric element according to claim 3,
wherein the external electrodes comprise a plurality of layers stacked in a direction perpendicular to the side face of the stack and, among the plurality of layers, the layer that adjoins the side face of the stack includes a higher content of the glass material than the other layers.

7. The multi-layer piezoelectric element according to claim 3,
wherein an isolated section, of which thickness gradually decreases toward the periphery and which is separated from the side face of the stack, is formed in a peripheral portion of the external electrode.

8. The multi-layer piezoelectric element according to claim 7,
wherein voids exist between the isolated section and the side face of the stack.

9. The multi-layer piezoelectric element according to claim 7,
wherein an insulating resin is interposed in at least a part of the space between the isolated section and the side face of the stack.

10. The multi-layer piezoelectric element according to claim 7,
wherein the external electrodes comprise a plurality of layers stacked in a direction perpendicular to the side face of the stack, and an outer layer has higher thermal expansion coefficient than an inner layer has.

11. The multi-layer piezoelectric element according to claim 10,
wherein, among the plurality of layers, the layer that adjoins the side face of the stack protrudes beyond the other layers toward the periphery.

12. The multi-layer piezoelectric element according to claim 10,
wherein the isolated section consists only of the layers that adjoin the side face of the stack.

13. The multi-layer piezoelectric element according to claim 1, wherein the porous metal layer is constituted from a plurality of partial metal layers dispersed between the two piezoelectric layers that adjoin the porous metal layer in the stacking direction, and the partial metal layers are disposed to be separate from each other.

14. The multi-layer piezoelectric element according to claim 12, wherein the metal layers disposed on both sides to adjoin the porous metal layer in the stacking direction have the same polarity.

15. The multi-layer piezoelectric element according to claim 12, wherein a part of the covering member infiltrates between the partial metal layers which adjoin each other.

16. The multi-layer piezoelectric element according to claim 15, wherein a part of the covering member that infiltrates between the partial metal layers covers the surface of the partial metal layers.

17. The multi-layer piezoelectric element according to claim 1, wherein a plurality of porous metal layers are disposed in an orderly arrangement in the stacking direction of the stack, and a part of the covering member infiltrates between the piezoelectric layers where the porous metal layer are disposed.

18. The multi-layer piezoelectric element according to claim 1, wherein the part of the covering member which infiltrates between the piezoelectric layers satisfies the relation of $D>0.1\,t$ where t is thickness of the covering member in the stacking direction thereof and D is depth of infiltrating between the piezoelectric layers.

19. An injection apparatus comprising:
a container having an injection hole; and
the multi-layer piezoelectric element according to claim 1, wherein a liquid held in the container is driven by the multi-layer piezoelectric element to jet through the injection hole.

20. A fuel injection system comprising:
a common rail for storing a fuel at a high pressure;
the injection apparatus according to claim 19 for discharging the fuel stored in the common rail;
a pump for supplying the fuel at a high pressure to the common rail; and
an injection control unit that issues a drive signal to the injection apparatus.

* * * * *